United States Patent
Jabir

(10) Patent No.: US 9,223,917 B2
(45) Date of Patent: Dec. 29, 2015

(54) POLYNOMIAL SYNTHESIS

(75) Inventor: Abusaleh M. Jabir, Oxford (GB)

(73) Assignee: Oxford Brookes University, Oxford (GB)

( * ) Notice: Subject to any disclaimer, the term of this patent is extended or adjusted under 35 U.S.C. 154(b) by 1434 days.

(21) Appl. No.: 12/513,471

(22) PCT Filed: Nov. 5, 2007

(86) PCT No.: PCT/GB2007/004206
§ 371 (c)(1),
(2), (4) Date: Sep. 27, 2010

(87) PCT Pub. No.: WO2008/053239
PCT Pub. Date: May 8, 2008

(65) Prior Publication Data
US 2011/0010141 A1   Jan. 13, 2011

(30) Foreign Application Priority Data

Nov. 3, 2006   (GB) .................................. 0621951.3

(51) Int. Cl.
G06F 7/60 (2006.01)
G06F 17/10 (2006.01)
G06F 17/50 (2006.01)

(52) U.S. Cl.
CPC .................................. *G06F 17/5045* (2013.01)

(58) Field of Classification Search
CPC ............ G06F 17/5018; G06F 17/5036; G06F 17/5009; G06F 2217/16; G06F 2207/581; G05B 17/02; H03M 13/2735; H03M 13/3516; H04L 9/0637

USPC ............................................................ 703/2
See application file for complete search history.

(56) References Cited

PUBLICATIONS

Stankovic "Circuit Design from Kronecker Galois Field Decision Diagrams for Multiple-valued Functions" 1997 IEEE.*
Cools "ASIC Synthesis of a Flexible 80 Mbit/s IReed-Solomon Codec" 1994 ACM.*
PCT/GB2007/004206, PCT Search Report dated Apr. 21, 2008.
PCT/GB2007/004206, PCT Written Opinion dated Apr. 21, 2008.
Jabir, Abusaleh M. and Pradhan Dhiraj K. MODD: A New Decision Diagram and Representation for Mutiple Output Binary Functions, Design, Automation and Test in Europe Conference and Exhibition, 2004, Proceedings Feb. 16-20, 2004, Piscataway, NJ, USA, IEEE, vol. 2, Feb. 16, 2001, pp. 1388-1389, XP010684915, ISBN: 0-7695-2085-5, p. 1388-1389.

(Continued)

*Primary Examiner* — Saif Alhija
(74) *Attorney, Agent, or Firm* — Ice Miller LLP

(57) ABSTRACT

Galois Field circuit production apparatus for fabricating a polynomial over $GF(2^m)$ in a circuit, comprising, an input device for allowing a specification relating to a desired polynomial over $GF(2^m)$ to be entered, a processor and memory for producing an improved, and preferably optimized, netlist, and means for fabricating a circuit from an improved netlist, wherein the processor and memory are configured to factorize a netlist corresponding to an input specification, determining common factors by passing through chains of multipliers following chains of adders, and to use an optimization algorithm on the factorized net list to generate an improved net list, and wherein the means for fabricating operably fabricates a circuit based on the improved netlist produced by the processor.

21 Claims, 10 Drawing Sheets

(56) References Cited

PUBLICATIONS

Stankovic, Radomir-S., Drechsler, Rolf Circuit Design from Kronecker Galois Field Decision Diagrams for Multiple-Valued Functions, Multiple-Valued Logic, 1997, Proceedings, 1997 27th International Symposium on Antigonish, NS, Canada May 28-30, 1997, Los Alamitos, CA, USA, IEEE Comput. Soc. US, May 28, 1997, pp. 276-280, XP010232722, ISBN: 0-8186-79107, p. 275-p. 276, p. 278-280.

Khan, Mozammel H., Perkowski, Marek A. and Kemtopf, Pawel Multi-Output Galois Field Sum of Products Synthesis with New Quantum Cascades, Proceedings 2003 33rd, IEEE International Symposium on Multiple-Valued Logic, ISMVL 2003. Tokyo, Japan, May 16-19, 2003, International Symposium on Multiple-Valued Logic, ISMVL, Los Alamitos, CA : IEEE Comp. Soc, US, May 16, 2003, pp. 146-153, XP010640324, ISBN: 0-7696-1918-0, p. 149-p. 151.

Jabir, Abusaleh M., Pradhan, Dhiraj K. and Mathew, Jimson an Efficient Technique for Synthesis and Optimization of Polynomials in GF(2m), IEEE/ACM International Conference on Computer Aided Design—Digest of Technical Papers (IEEE CAT No. 06CH37762), IEEE Piscataway, NJ, USA, 2006, p. 7, pp., XP002475427, ISBN: 1-59593-389-1.

\* cited by examiner

POLYNOMIAL SYNTHESIS

PRIORITY

The present application is related to, and claims the priority benefit of, International Patent Application Serial No. PCT/GB2007/004206, filed Nov. 5, 2007, which is related to, and claims the priority benefit of, Great Britain Patent Application Serial No. 0621951.3, filed Nov. 3, 2006. The contents of each of these applications are hereby incorporated by reference in their entirety into this disclosure.

The present invention relates to synthesis and optimization of polynomials over finite fields in hardware.

It is known to design systolic VLSI (very large scale integration) integrated circuits. These have numerous uses. Polynomials over finite fields in the form of $GF(2^m)$ are useful in a number of fields in particular area control codes and public key crypto systems (such as the elliptic curve crypto system) and in VLSI testing and digital signal processing.

Present attempts to realise polynomials over $GF(2^m)$ as integrated circuits result in inefficient circuits with a large area, significant delay and high power consumption. Designing testable hardware is frequently very important in chip design and the inefficient circuits produced may not be testable.

Many existing methods of synthesize apply only to multipliers or sequential and hybrid exponentiation over $GF(2^m)$ or for addition over $GF(2^m)$ (such as with m 2-input EXOR gates). However polynomials over $GF(2^m)$ can constitute additional addition, multiplication, and exponentiation, in different configurations, and these have not been designed efficiently.

It is an object of the present invention to improve on known synthesis and optimization methods and in particular to reduce the area, delay and power consumption by providing a more efficient method of synthesis.

It has been found that according to this invention this can be done by including a preprocessing step before details are passed onto industrial tools for producing the chip such as the Synopsis (RTM) design compiler without having to change the design compiler itself.

According to a first aspect of the invention there is provided Galois Field circuit production apparatus for fabricating a polynomial over $GF(2^m)$ in a circuit, comprising an input device for allowing a specification relating to a desired polynomial over $GF(2^m)$ to be entered, a processor and memory for producing a, preferably optimized, netlist, and optionally means for fabricating a circuit from a netlist, wherein the processor and memory are configured to decompose a diagram based on the initial specification and generate a first netlist, and optionally wherein the means for fabricating operably fabricates a circuit from a netlist based on the first netlist produced by the processor.

According to a second aspect of the invention there is provided a Galois Field circuit production apparatus for fabricating a polynomial over $GF(2^m)$ in a circuit, comprising, an input device for allowing a specification relating to a desired polynomial over $GF(2^m)$ to be entered, a processor and memory for producing an improved, and preferably optimized, netlist, and optionally means for fabricating a circuit from a netlist, wherein the processor and memory are configured to factorize a netlist corresponding to an input specification, (preferably determining common factors by passing through chains of multipliers following chains of adders) and/or to use an optimization algorithm on the factorized net list to generate an improved net list, and preferably wherein the means for fabricating operably fabricates a circuit based on the improved netlist produced by the processor.

According to a third aspect of the invention there is provided a method of fabricating a polynomial over $GF(2^m)$ in a circuit, comprising the steps of, taking a specification relating to a desired polynomial over $GF(2^m)$, using a processor to factorize a netlist corresponding to the specification, determining common factors by passing though chains of multiplier following chains of adders, using an optimization algorithm on the factorized net list to generate an optimized net list, and preferably fabricating a circuit based on the optimized netlist.

According to a fourth aspect of the invention there is provided a method of fabricating a polynomial over $GF(2^m)$ in a circuit, comprising the steps of, taking a specification relating to a desired polynomial over $GF(2^m)$, using a processor to decompose a diagram based on the initial specification and, generate a first net list, and preferably fabricating a circuit from a netlist based on the first netlist.

According to a fifth aspect of the invention there is provided a circuit production apparatus or method for fabricating a function in a circuit, comprising an input device for allowing a specification relating to the function to be entered or step of accepting a specification relating to the function, means for or step of encoding an entered function in terms of a polynomial over $GF(2^m)$ a processor and memory for or use of for producing a, preferably optimized, netlist, optionally means or step of for fabricating a circuit from a netlist, wherein the processor and memory are configured or used to decompose a diagram, such as a GPDD, based on the polynomial over $GF(2^m)$ and generate a first net list, and optionally wherein the means for fabricating operably fabricates a circuit from a netlist based on the first netlist produced by the processor.

Preferably the netlist based on the first netlist is the first netlist.

Preferably the apparatus comprises means for factorizing the first netlist, the means to factorize is configured to factorize the first netlist, determining common factors by passing through chains of multipliers following chains of adders, and/or there is an optimization algorithm stored in the memory and the processor is configured to run the optimization algorithm on the first or the factorized net list to generate an improved, preferably optimized, net list and wherein the means for fabricating operably fabricates a circuit based on the improved netlist produced by the processor and/or comprising means to a construct a first netlist, the means to construct is configured to decompose a diagram based on the initial specification and generate a first net list, the processor and memory configured to use the first net list as the basis for factorization and improvement using the optimization algorithm. More preferably the optimization algorithm processes recursively from the variable or constant nodes towards the root node, and/or for each $GF(2^m)$ multiplier/adder node, one or more of and preferably all of the following are carried out: if its two children are constants then, the $GF(2^m)$ multiplier/adder node value is replaced with the addition or multiplication over $GF(2^m)$ of its two children, if the $GF(2^m)$ multiplier/adder node is equal to the $GF(2^m)$ multiplication of a child with 1 or the $GF(2^m)$ addition of a child with 0 then it is replaced with the value of that child (constant propagation), if the $GF(2^m)$ multiplier/adder node value is equal to the value of the child $GF(2^m)$ multiplied with 0 is added to itself the node value is replaced with 0.

Preferably the decomposing of the diagram is of a Galois Polynomial decision diagram or a diagram which is substantially equivalent and/or the decomposing is achieved by cutting nodes of the diagram into sets. More preferably the cut is made directly above the node with the minimum number of corresponding parents and/or the two sets comprise a first set including the nodes from the top of the initial diagram down to, but not including the node with the minimum number of parent nodes, and a second set including the node with the minimum number of parent nodes.

Preferably the first net list is an expression directed acyclic graph based multiple output shared netlist and/or the decomposing is multiplicative and/or additive.

Preferably the apparatus comprises means for calculating polynomial coefficients wherein the means for calculating is configured to calculate the coefficients for the polynomial corresponding to a specification received by the input and to be fabricated into a circuit. More preferably the means for calculating is configured to store the coefficient for a first exponentiation term and calculate the coefficient for a lower exponentiation term by using the stored coefficient for the first term and using an incremental method preferably comprising multiplication and/or addition. More preferably the calculated coefficients are stored in the memory, for use in producing the (first) net list, in the form of a directed acyclic graph such as a Galois polynomial decision diagram.

Preferably the processor is configured to realize an exponentiation in the polynomial into a netlist by repeated multiplication and/or the first exponentiation of a first variable to be generated is stored in the memory and second exponentiation of the first variable is expressed in terms of a third exponentiation of the variable multiplied by the first exponentiation and then realized by generating the third exponentiation and multiplying it with the stored result of the first exponentiation.

Preferably m is greater than 1 and the factorization and optimization results in a first optimized netlist containing word level blocks, which apparatus comprises synthesizing means configured to synthesize the word level blocks at the bit level, and wherein the processor and memory are configured so that the bit level output is further factorized, determining common factors by passing through chains of multiplier following chains of adders, and to use the optimization algorithm on the factorized bit level net list to generate an optimized bit level net list wherein the means for fabricating operably fabricates a circuit based on the optimized bit level netlist produced by the processor, and/or the factorization and optimization results in a first optimized netlist containing word level blocks and/or wherein the first netlist contains word level blocks synthesizing means configured to synthesize the word level blocks at the bit level, and conversion means for converting the bit level output to a diagram, such as a GPDD, and the processor and memory and/or means to construct are configured to decompose a diagram, produced by the means for converting, to generate a bit level net list, the apparatus preferably configured to factorize and/or optimize the bit level net list as an optimized bit level netlist and wherein the means for fabricating operably fabricates a circuit based on the (optimized) bit level netlist.

Preferably the conversion means comprises the means for calculating.

There may be provided method of verifying whether a plurality of netlists, produced by an aspect of the invention, are functionally equivalent by comparing their structure to see if they are substantially the same and/or a method of verifying whether a plurality of polynomials over $GF(2^m)$ or initial specification corresponding to them are equal by comparing the node structure of the optimized netlists, corresponding to the polynomials or specifications and/or The cut may be made directly above the node with the maximum number of corresponding parents and/or the two set comprise a first set including the nodes from the top of the initial diagram down to but not including the node with the maximum number of parent nodes and a second set including the node with the maximum number of parent nodes and/or the initial specification relates to an integer adder and the means for fabricating is configured to produce an integer adder circuit.

BACKGROUND

The description below is enabling for the skilled person in the field but by way of clarification as to the notation in the mathematics presented the following is given by way of background.

Let GF(N) denote a set of N elements, where N is a power of a prime number, with two special elements 0 and 1 representing the additive and multiplicative identities respectively, and two operators addition '+' and multiplication '·'. GF(N) defines a finite field, also known as Galois Field, if it forms a commutative ring with identity over these two operators in which every element has a multiplicative inverse.

Finite fields over $GF(2^m)$ and $m \geq 2$ can be generated with primitive polynomials (PP) of the form $p(x)=x^m+\Sigma_{i=0}^{m-1} c_i x^i$, where $c_i \in GF(2)$ [1]. For any $\alpha, \beta \in GF(2^m)$, if $\alpha$ and $\beta$ are in their polynomial basis as $\alpha(x)=\Sigma_{i=0}^{m-1} \alpha_i x^i$ and $\beta(x)=\Sigma_{i=0}^{m-1} \beta_i x^i$, where $\alpha_i, \beta_i \in \{0,1\}$ and $0 \leq i < m$, then multiplication over $GF(2^m)$ can be defined as $w(x)=\alpha(x) \cdot \beta(x) \mod p(x)$, where p(x) represents the primitive polynomial used to generate the fields [1], [9], [25]. $\alpha+\beta$, i.e. addition over $GF(2^m)$, is the pairwise EXOR of the terms in the polynomials or the bitwise EXOR of the bit vectors corresponding to $\alpha(x)$ and $\beta(x)$.

This table shows the addition tables over GF(4).

| + | 0 | 1 | $\alpha$ | $\beta$ |
|---|---|---|---|---|
| 0 | 0 | 1 | $\alpha$ | $\beta$ |
| 1 | 1 | 0 | $\beta$ | $\alpha$ |
| $\alpha$ | $\alpha$ | $\beta$ | 0 | 1 |
| $\beta$ | $\beta$ | $\alpha$ | 1 | 0 |

This table shows the multiplication tables over GF(4).

| × | 0 | 1 | $\alpha$ | $\beta$ |
|---|---|---|---|---|
| 0 | 0 | 0 | 0 | 0 |
| 1 | 0 | 1 | $\alpha$ | $\beta$ |
| $\alpha$ | 0 | $\alpha$ | $\beta$ | 1 |
| $\beta$ | 0 | $\beta$ | 1 | $\alpha$ | shows the addition and multiplication tables over GF(4). Here $\alpha$ and $\beta$ are assumed to be elements in GF(4). For example assume that $\alpha(x)=x$, and $\beta(x)=x+1$. $\alpha+\beta=\alpha(x)+\beta(x)=x+x+1=1$. There is only one primitive polynomial for generating GF(4), which is $p(x)=x^2+x+1$. Now $\alpha \cdot \beta=\alpha(x) \cdot \beta(x) \mod p(x) = x \cdot (x+1) \mod x^2+x+1=1$.

In this application primitive polynomials will be considered in their decimal notation. For example the primitive polynomial $p(x)=x^3+x+1$ in GF(8) can be represented by the bit vector [1,0,1,1], which is 11 in decimal.

The following notation is used. Let $I_N=\{0,1,\ldots,N-1\}$, and $\delta: I_N \to GF(N)$ be a one-to-one mapping with $\delta(0)=0$, $\delta(1)=1$ and, without loss of generality, $\delta(2)=\alpha$, $\delta(3)=\beta$, etc.

Given a variable $x_i$ in GF(N) and $\pi_i \in I_N$ ($1 \leq i \leq n$, n is the number of inputs), $x_i$ can appear in one of the N polarities denoted by $x_{i,\pi_i}=x_i+\delta(\pi_i)$. Certain polarities require more resources to represent a polynomial than others. As an example, let $f(x_1,x_2)=\alpha x_1 x_2$ represent a function in 0-polarity in GF(3), i.e. both $x_1$ and $x_2$ are in 0-polarity (note that $x_{i,0}=x_i$). In another polarity with $x_1$ in 1-polarity and $x_2$ in 2-polarity, replacing $x_1$ with $x_{1,1}-1$ and $x_2$ with $x_{2,2}-\delta(2)=x_{2,2}-\alpha$ and simplifying we get $f(x_1,x_2)=1+x_{2,2}+\alpha x_{1,1}+\alpha x_{1,1}x_{2,2}$, which contains more terms in this case. Finding an optimal polarity can be a difficult problem.

Any function over GF(N) can be expanded in its literal based form as $f(x_1, \ldots, x_i, \ldots, x_n) = \Sigma_{e=0}^{N-1} g_e(x_i) f|_{x_i=\delta(e)}$ where $g_e(x_i)=1-[x_i-\delta(e)]^{N-1}$. Here $g_e(x_i)$ is called a literal over GF(N). This can be viewed as generalization of Shanon's expansion to GF(N). Such a literal based form allows Multiple-Valued Decision Diagram (MDD)-like canonic graph-based representations as shown in FIG. 3.

Here the internal nodes IN represent the variables of expansion, xi in this case, whereas the terminal nodes TN represent the values of the function corresponding to each value of $x_i$ represented by the edges. However since the MDDs are defined in MIN-MAX postalgebra, this representation will be called (M)ultiple (O)utput (D)ecision (D)iagram or MODD to distinguish it from the MDDs. There are two MODD reduction rules: (a) If all the N children of a node v point to the same node w, then delete v and connect the incoming edge of v to w. (b) Share equivalent subgraphs. A reduced MODD can be further optimized and normalized based on additional two rules mentioned in "An Efficient Graph Based Representation of Circuits and Calculation of Their Coefficients in Finite Field," in *Proc. Int. Workshop on Logic and Synth.* (*IWLS'05*), California USA, June 2005 pp. 218-225. An MODD which is reduced by all 4 rules will be called a (Z)ero suppressed and (N)ormalized MODD or ZNMODD.

DESCRIPTION

Embodiments of the invention will now be described, by way of example only, with reference to the following drawings in which.

Figure 1:
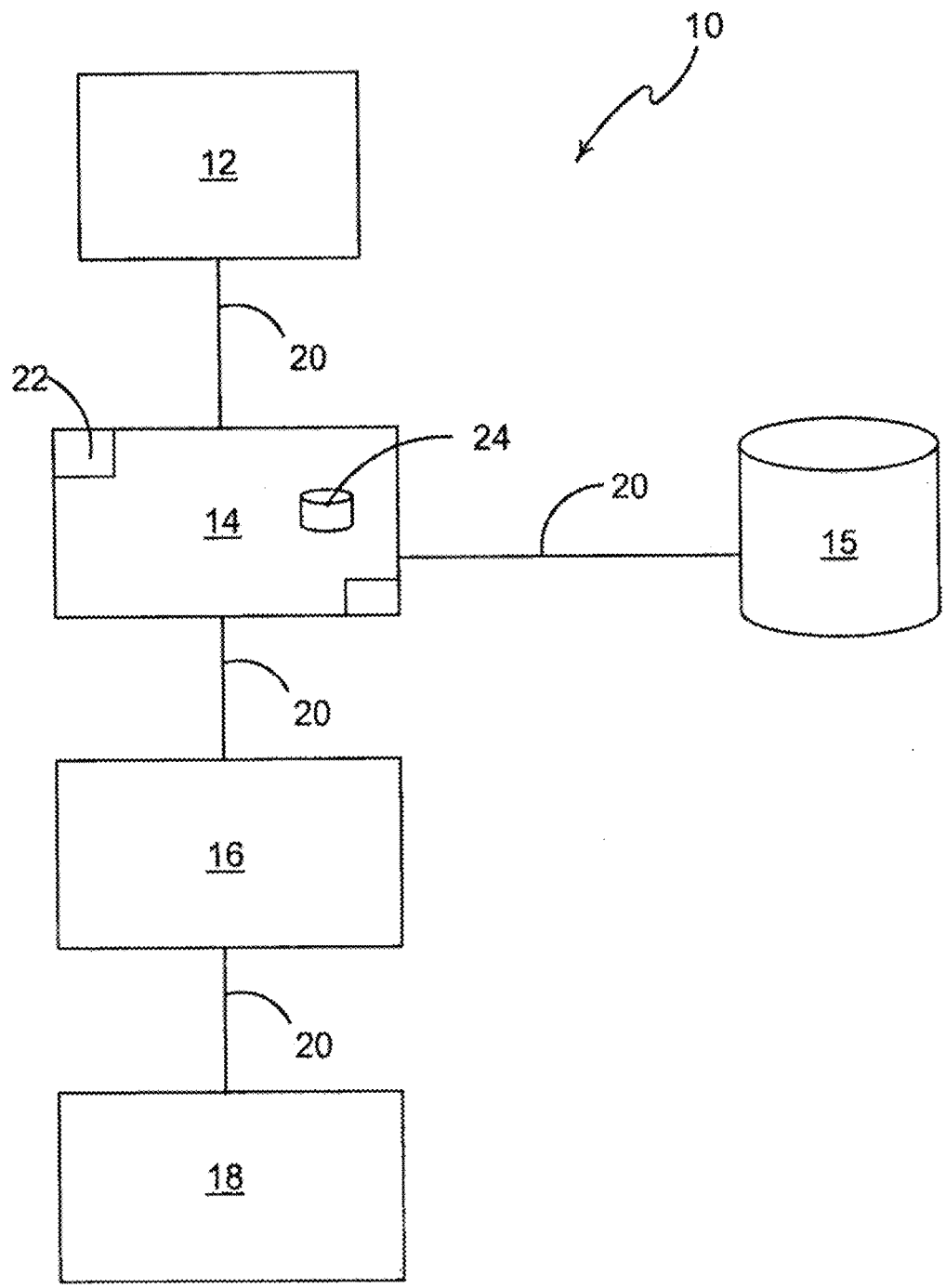
FIG. 1 is an overview of a circuit production system in accordance with the invention.

In FIG. 1 there is shown a circuit production system 10 comprising an input 12, a preprocessing computer 14, a look up database 15, a design complier 16 a production plant 18 and communication paths 20.

The input 12 allows for a user to enter polynomials in the form of an input specification over GF($2^m$) for which a circuit is desired. The input 12 may comprise a keyboard or other conventional input device. It may also comprise a computer which outputs polynomials from previous calculations.

Preprocessing computer 14 may comprise a conventional computer but is configured, such as by use of specific software, to apply the preprocessing steps described below based on the input specification corresponding to polynomials. The computer 14 comprises a processor 22 and a memory, 24. The memory 24 may be preloaded with coefficients for polynomials corresponding to the input specification. Computer 14 is connected to input 12, look up database 15, and complier 16 by communication paths 20.

Look up database 15 comprises a memory such as a hard disk containing data including polynomial coefficients. The database 15 may be part of the Internet.

Design compiler 16 is conventional and takes a net list from the computer 14, preferably in the form of VHDL but could be in any other appropriate code. And produces a circuit design, matching the netlist which is ready for manufacture. Compiler 16 is connected to preprocessing computer 14 and plant 18 by communication paths 20. Complier 16 may be the Synopsis (RTM) design complier or other suitable industrial tool.

Production plant 18 manufactures circuits such as VLSI chips based on the circuit designs.

In use the user or computer inputs polynomials over GF($2^m$) into input 12, such as in the form of truth-tables or a directed acyclic graph (DAG) based representations of truth-tables or initial net lists. These are then sent via a communication path 20 to preprocessing computer 14. Computer 14 then applies preprocessing steps in accordance with the invention as described below and produces a netlist in VHDL. The netlist is sent to the design compiler 18 via a communication path 20. The design compiler then produces a circuit design matching the VHDL and send this to the production plant 18 via communication path 20. Lastly the production plant 18 manufactures a polynomial circuit matching the design. The produced circuit can then perform the polynomial input by the user or computer.

Figure 2:
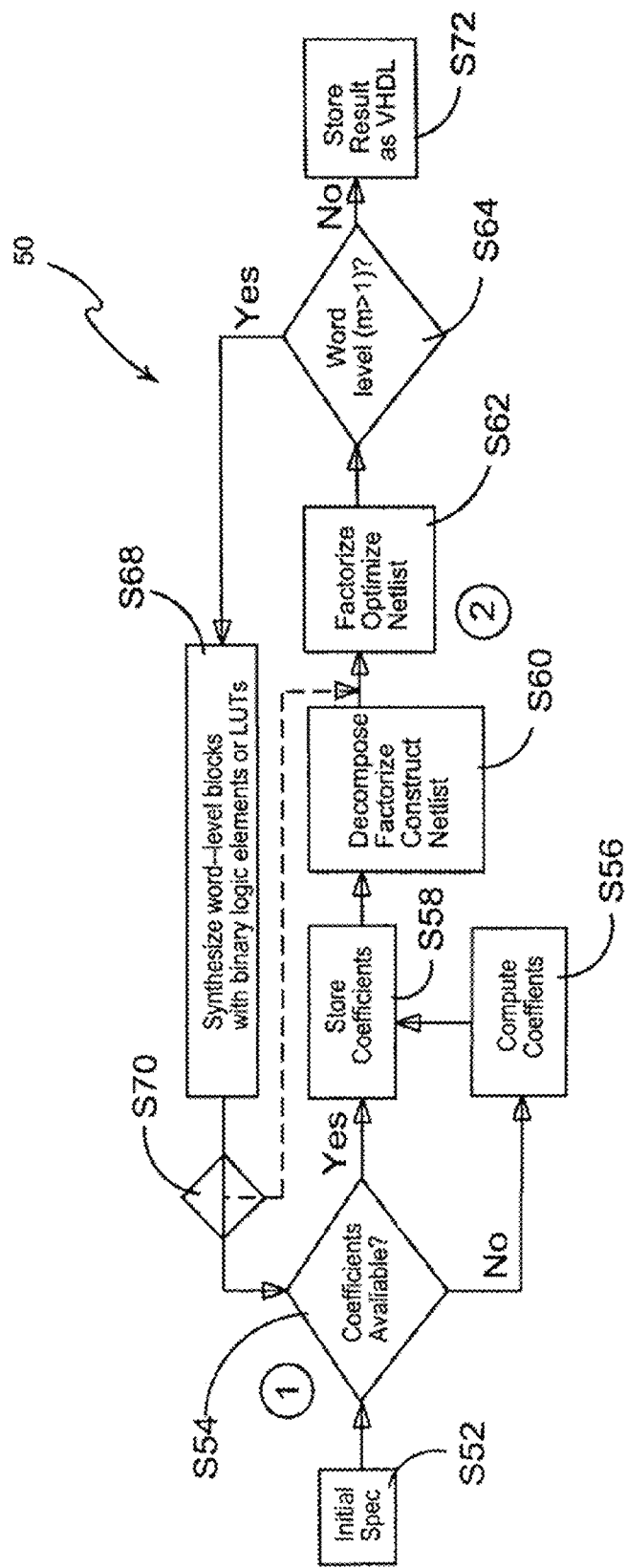
FIG. 2 is a flow diagram of preprocessing steps performed by a computer depicted in FIG. 1.
Figure 3:
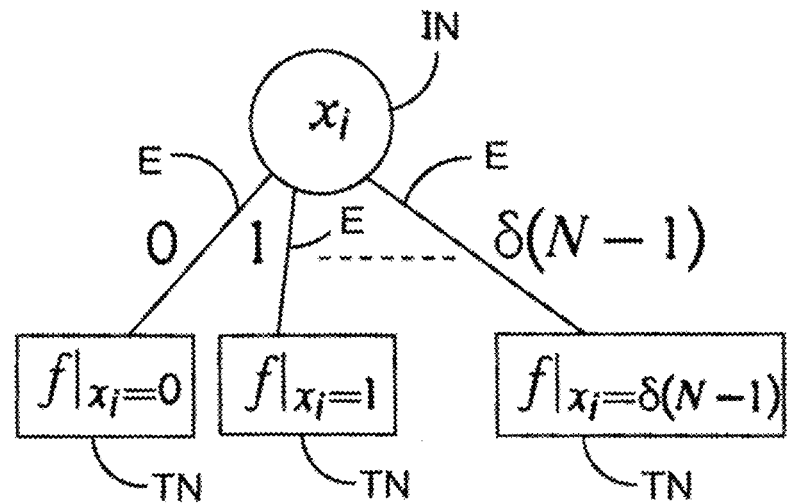
FIG. 3 is a Multiple Output Decision Diagram.

In FIG. 2 is shown an example of preprocessing steps 50 performed by computer 14.

First at step S52 the initial spec from input 12 is reviewed. Its is determined by computer 14 whether the initial specification is a truth-table or a directed acyclic graph (DAG) based representations of truth-tables or an initial net list, e.g. DAG based representations of the initial specifications as AND-OR PLA or VHDL/verilog net list forms.

At step S54 the computer 14 determines if the coefficients for the required polynomials are available in memory 24 or look up database 15 either in a graph-based form or in terms of a network of adders or multipliers over GF($2^m$), i.e. in a net list form. If they are not available the computer 14 proceeds to step S56 and if they are it skips straight to step S58.

At step S56 the computer 14 calculates the required coefficients, and moves on to step S58. At step S58 the coefficients that have been calculated or looked up are stored in memory 24 in diagrammatic form. The polynomials are determined by their coefficients and therefore correct determination of coefficients is important.

Next at step S60 if the graph-based representation of the coefficients is given, then the computer 14 performs a graph-based decomposition over GF($2^m$) to construct the net list of adders and multipliers. Then at step S62 the net list is factorized and optimized and the computer 14 proceeds to step S64.

At step S64 the computer 14 determines the word level of the polynomial/optimized net list. If the net list is not at the bit level i.e. m is greater than one then it moves on to step S68 but if not i.e. it is over GF(2) the computer 14 skips directly to step S72.

At step S68 the computer 14 synthesizes word level blocks with binary logic elements or look up tables (LUTS) to drill down to the bit level. Next at step S70 it is determined whether the coefficient stages need to be returned to. If yes the computer goes back to step S62 but if not it goes back to step S54.

Finally once all of steps S52 to S70 have been completed the necessary number of times (which will either be once for m=1 or twice for m>1) the computer 14 stores the result as a VHDL, or other format, in memory 24 at step S74 and sends this via communication path 20 to the design compiler 16.

Step S56 requires the coefficients are calculated from the initial input DAG from step S52 to be stored in another DAG at step S58 to form the starting point of the synthesis process.

To calculate the coefficients at step S54 conventional methods may be used.

Given a function $f(x_n, x_{n-1}, \ldots, x_1)$ in GF(N) (N is a power of a prime number) and a polarity number $t$, $f$ can be represented in the following canonical form.

$$f(x_n x_{n-1}, \ldots, x_1) = \kappa_{0,t} + \kappa_{1,t}\tilde{x}_1 + \kappa_{N,t}\tilde{x}_2 + \ldots + \kappa_{i,t}\tilde{x}_{j_k}^{i_k}\tilde{x}_{j_{k-1}}^{i_{k-1}} \ldots \tilde{x}_{j_1}^{i_1} + \ldots + \kappa_{N^n-1,t}\tilde{x}_n^{N-1}\tilde{x}_{n-1}^{N-1}\ldots\tilde{x}_1^{N-1}.$$

Here $\kappa_{i,t}$ represents the coefficient of the ith term containing k number of variables in polarity number t, where both i and t are defined in the radix-N number system as $i = i_k N^{j_k} + i_{k-1} N^{j_{k-1}} + \ldots + i_1 N^{j_1}$ and $t = \pi_n N^{n-1} + \pi_{n-1} N^{n-2} + \ldots + \pi_1$.

Further, each $\pi_q$ represents the polarity of the variable $x_q$ and $1 \leq q \leq n$, i.e. $x_{q,\pi_q} = x_q + \delta(\pi_q)$. Here $\tilde{x}_l$ represents the fact that $x_l$ is in any one of the polarities $\{0, 1, \ldots, N-1\}$, as determined by t. For example the term associated with the coefficient is $\kappa_{i,t}$ is $\tilde{x}_{j_k}^{i_k}\tilde{x}_{j_{k-1}}^{i_{k-1}} \ldots \tilde{x}_{j_1}^{i_1}$, where the polarity of each variable is determined by t.

In many cases the MODD (or MDD) may be available as a part of existing resources during a synthesis, verification or simulation process, in which case the coefficients can be derived from the graphs by means of a known efficient path oriented technique such as is known. We call this technique 'CompByPath'.

We have the following.

Theorem 1:

Let $f(x_n, x_{n-1}, \ldots, x_1)$ represent an n variable function in GF(N). Its ith coefficient corresponding to a term containing k number of variables in the polarity number t is $$\kappa_{i,t} = \qquad (1)$$
$$(-1)^k \sum_{x_{j_k}=\delta(0)}^{\delta(N-1)} \sum_{x_{j_{k-1}}=\delta(0)}^{\delta(N-1)} \ldots \sum_{x_{j_1}=\delta(0)}^{\delta(N-1)} \theta_{i,t}(\tilde{x}_1, \tilde{x}_2, \ldots, \tilde{x}_n) f(x_{j_k}, x_{j_{k-1}},$$
$$\ldots, x_{j_1}, -\delta(\pi_l), -\delta(\pi_{l-1}), \ldots, -\delta(\pi_1)),$$

where $\delta(\pi_l), \delta(\pi_{l-1}), \ldots, \delta(\pi_1)$ are the polarities of the variables $x_l, x_{l-1}, \ldots, x_1$ as determined by t.

Here $\theta_{i,t}$ is defined in "A Theory of Galois Switching Functions" *IEEE Trans. Comp.*, vol. C-27, no. 3 pp. 239-249, March 1978. In Eq. (1) those variables which are assigned any value will be called assigned variables, and those that have not been will be called unassigned variables.

The complexity of Algorithm CompByPath is associated with (i) the number of paths which do not terminate into a 0-terminal node in the MODD or ZNMODD, and (ii) the number of missing unassigned variables in the path. It has been observed that for most benchmarks the algorithm found the coefficients quickly. Application of this algorithm for determining all the coefficients in large fields can render the process slow. A far more efficient technique is proposed below.

Speeding-Up in Large Fields:

Let the partial coefficient (PC) be defined as $$PC_{i,t}(\tilde{x}_{j_k}^{i_k}\tilde{x}_{j_{k-1}}^{i_{k-1}} \ldots \tilde{x}_{j_1}^{i_1}) = \theta_{i,t}(\tilde{x}_1, \tilde{x}_2, \ldots, \tilde{x}_n) \qquad (2)$$
$$f(x_{j_k}, x_{j_{k-1}}, \ldots, x_{j_1}, -\delta(\pi_l), -\delta(\pi_{l-1}), \ldots, -\delta(\pi_1))$$

Then Eq. (1) becomes $$\kappa_{i,t} = (-1)^k \sum_{x_{j_k}=\delta(0)}^{\delta(N-1)} \sum_{x_{j_{k-1}}=\delta(0)}^{\delta(N-1)} \ldots \sum_{x_{j_1}=\delta(0)}^{\delta(N-1)} PC_{i,t}(\tilde{x}_{j_k}^{i_k}\tilde{x}_{j_{k-1}}^{i_{k-1}} \ldots \tilde{x}_{j_1}^{i_1}),$$

Lemma 1:

Let $\kappa_{i,t}$ and $\kappa_{i',t}$ be the coefficients corresponding to the two terms $\tilde{x}_{j_k}^{i_k}\tilde{x}_{j_{k-1}}^{i_{k-1}} \ldots \tilde{x}_{j_1}^{i_1}$ and $\tilde{x}_{j_k}^{i'_k}\tilde{x}_{j_{k-1}}^{i'_{k-1}} \ldots \tilde{x}_{j_1}^{i'_1}$ respectively. Also let $i > i'$ and $i_l \leq i'_l$ for $1 \leq l \leq k$. Then $\kappa_{i',t}$ can be computed from $\kappa_{i,t}$ by multiplying the PCs of $\kappa_{i,t}$ by each value of $\tilde{x}_{j_k}^{i_k-i'_k}\tilde{x}_{j_{k-1}}^{i_{k-1}-i'_{k-1}} \ldots \tilde{x}_{j_1}^{i_1-i'_1}$ and then adding them together without revisiting the ZNMODD (MODD), i.e.

$$\kappa_{i',t} = (-1)^k \sum_{x_{j_k}=\delta(0)}^{\delta(N-1)} \sum_{x_{j_{k-1}}=\delta(0)}^{\delta(N-1)} \ldots$$
$$\sum_{x_{j_1}=\delta(0)}^{\delta(N-1)} PC_{i,t}(\tilde{x}_{j_k}^{i_k}\tilde{x}_{j_{k-1}}^{i_{k-1}} \ldots \tilde{x}_{j_1}^{i_1}) \cdot \tilde{x}_{j_k}^{i_k-i'_k}\tilde{x}_{j_k}^{i_{k-1}-i'_{k-1}} \ldots \tilde{x}_{j_1}^{i_1-i'_1}.$$

Lemma 1 gives us an opportunity to compute coefficients incrementally without having to visit the ZNMODD each time, i.e. without resorting to Algorithm CompByPath each time.

Let us represent each unassigned variable with 1 and each assigned variable with 0. This results in a set of binary vectors of dimension n. Each position in the binary vector corresponds to whether that particular input variable is assigned or not. The set of all such binary vectors defines a lattice over Boolean algebra. The Greatest Lower Bound (GLB) of this lattice is [00 . . . 0] (i.e. all variables assigned), while the Least Upper Bound (LUB) is [11 . . . 1] (i.e. all variables unassigned). Clearly an n-variable function in GF(N) will have $2^n$ points in the lattice. For GF(2) each point in the lattice will correspond to a single coefficient. However for GF(N) and N>2 each point will correspond to a range of coefficients. For each 1 in the vector corresponding to a point in the lattice, apart from the GLB, the corresponding variable will have N different exponents in the term, ranging from 1 to N−1. Assume that each point in the lattice represents a term having exponents equal to N−1 for all the unassigned variables. If the coefficients of all such terms are known, then the coefficients of all the remaining terms having unassigned variables in the same place can be determined by Lemma 1, without visiting the MODD.

The following example best describes this.

EXAMPLE 1

Figure 8:
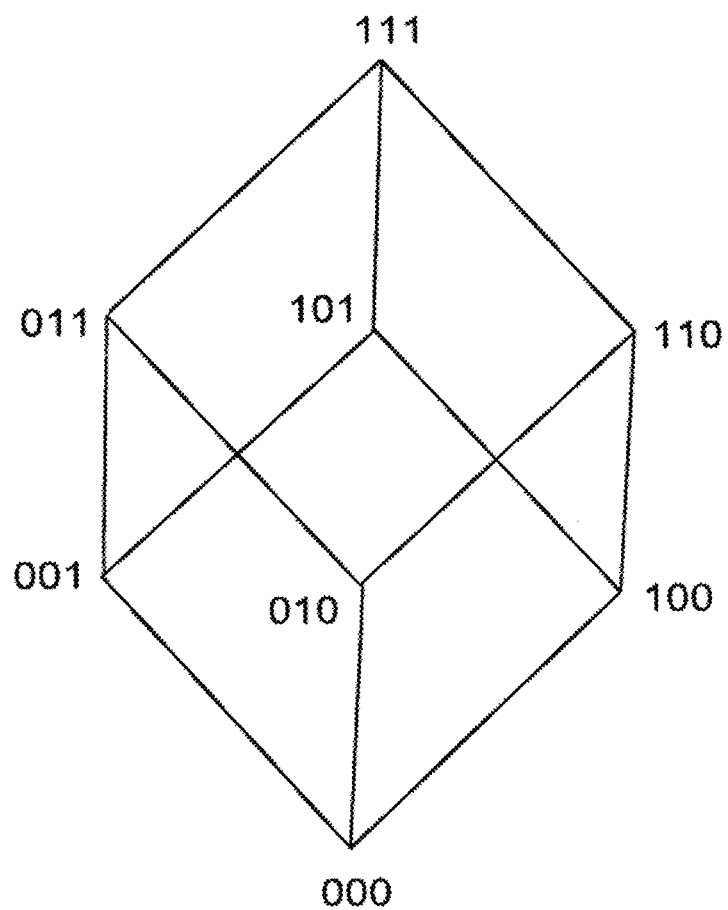
FIG. 8 is an example lattice for a 3 input function in GF(4)

FIG. 8 shows an example lattice for a 3-input function in GF(4). The GLB corresponds to the coefficient $\kappa_{0,t}$. The LUB corresponds to the terms $x_{1,\pi_1}x_{2,\pi_2}x_{3,\pi_3}, x_{1,\pi_1}x_{2,\pi_2}x_{3,\pi_3}^3, \ldots, x_{1,\pi_1}^3 x_{2,\pi_2}^3 x_{3,\pi_3}^3$, i.e. the coefficients $\kappa_{21,t}, \kappa_{22,t}, \ldots, \kappa_{64,t}$.

Similarly the point 001 corresponds to the terms $x_{3,\pi_3}$, $x_{3,\pi_3}^2$, and $x_{3,\pi_3}^3$ i.e. the coefficients $\kappa_{1,t}$, $\kappa_{2,t}$, and $\kappa_{3,t}$. Considering the point 001, the coefficient for $x_{3,\pi_3}^2$ can be computed as $\kappa_{2,t}=\Sigma_{x_3=0}^{\beta}(x_3+\delta(\pi_3))f(\delta(\pi_1),\delta(\pi_2),x_3)$ (Theorem 1) using Algorithm CompByPath. Here $PC_{2,t}=(x_3+\delta(\pi_3))f(\delta(\pi_1),\delta(\pi_2),x_3)$. If during this computation $PC_{2,t}$ is stored for the relevant values of $x_3$ from the MODD, then the coefficient of $x_{3,\pi_3}$ can be computed as $$\kappa_{i,t}=\Sigma_{x_3=0}^{\beta}PC_{2,t}(x_3+\delta(\pi_3))^{2-1}=\Sigma_{x_3=0}^{\beta}(x_3+\delta(\pi_3))^2 f(\delta(\pi_1),\delta(\pi_2),x_3)$$

by multiplying the values of $x_3+\delta(\pi_3)$ by the stored values of $PC_{2,t}$ and then adding them together, without having to revisit the MODD (Lemma 1). In this way other coefficients with smaller exponents can be determined from those with larger ones by Lemma 1.

Instead of conventional methods a new faster algorithm for computing coefficients has been derived based on Lemma 1. Assume that the exponent of $\kappa_{i,t}$ and that of $\kappa_{i',t}$ differ only in place s, and also that $i_s - i'_s = 1$. Then $\kappa_{i',t}$ can be computed from $\kappa_{i,t}$ by multiplying with the PCs of $\kappa_{i,t}$ the values of $\tilde{x}_{j_s}$ and adding them together, if the values of the PCs are stored while computing $\kappa_{i,t}$. Similarly another coefficient whose exponent differs from $\kappa_{i',t}$ in one place only and by one can be computed, and so on.

```
1 Algorithm GfCoeffHs1{
2    do{
3        Get a point pt in the lattice in ascending order;
4        if(pt is the GLB)
5            Compute by Theorem 1;
6        else{
7            Consider the κ_{i,t} with the highest exponent, i.e.
8            with i_k = i_{k-1} = ... = i_1 = N - 1 corresponding
9            to the 1s in pt;
10           Compute κ_{i,t} by Algorithm CompByPath;
11           For all i' which differ in one exponent and by one
12               Compute κ_{i',t} by Lemma 1 from its previous
13               coefficient;
14       }
15   }while(all points in the lattice aren't considered);
16 }
```

An algorithm for computing all the coefficients can be formulated as shown above. It is assumed that the information about unassigned variables represented by the point of the lattice under consideration is stored while executing Line 10 so that this information can be used to compute the other coefficients in Lines 11-12. One way of implementing Lines 11-13 is based on optimally storing the partial coefficients in hash-tables [29]. We call this algorithm 'CompBy1Diff'. Experimental results show that this algorithm can reduce computation time by several orders of magnitude.

Increased Efficiency for Large Fields:

An n-input function in GF(2) has $2^n$ lattice points. However if this same function is encoded in $GF(2^m)$, i.e. at the word-level with m-bit word-size, then the number of lattice points would come down to $2^{\lceil n/m \rceil}$. This is the total number of times Algorithm CompByPath will be executed. Hence, with large m the number of lattice points would be small, implying that the total number of times the Algorithm CompByPath is executed will also be small. However as m approaches n the number of terms whose exponents differ by one also increases. This implies that Algorithm CompBy1Diff will also execute more frequently.

Figure 4:
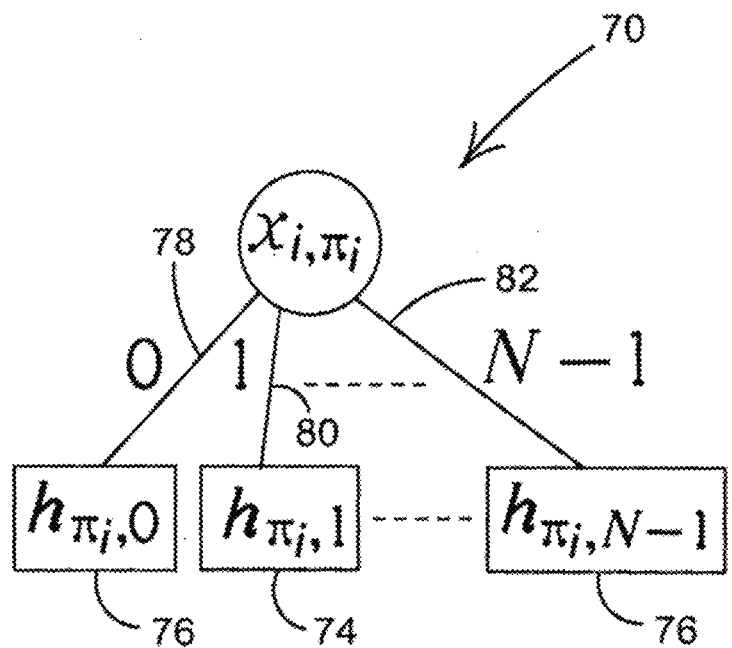
FIG. 4 is a Module Output Decision Diagram stored in the memory of the computer depicted in FIG. 1.

At step S58 the coefficients are stored in memory as they are computed in a reduced and (S)hared (G)alois (P)olynomial (D)ecision (D)iagram or SGPDD. Any function in GF(N) can be represented (expanded) based on the following polynomial form: $f(x_1, \ldots, x_i, \ldots, x_n) = h_{\pi_i,0} + \Sigma_{r=1}^{N-1} x_{i,\pi_i}^r h_{\pi_i,r}$ [29]. Here $h_{\pi_i,j}$ is the coefficient corresponding to the jth term in $\pi_i$ polarity. This is represented by means of the diagram 70 in FIG. 4. Here the terminal nodes 72, 74, 76 represent the coefficients over GF(N) while the edges 78, 80, 82 represent the exponents of $x_i$. The GPDD can be reduced as follows: Given two nodes v and w such that $child_i(v) = w$ and $0 \leq i \leq N-1$, (a) if all the nonzero edges of w point to the zero terminal node, then reconnect $child_i(v)$ to $child_0(w)$ and delete w, (b) Share equivalent sub graphs. A GPDD reduced based on these two rules can be shown to be canonic and minimal under a fixed variable ordering. A linear time GPDD reduction algorithm has been developed for GF(N) and any polarity, with N being any field. This algorithm is analogous to the BDD reduction algorithm described in, "Graph-Based Algorithms for Boolean Function Manipulation," R. Bryant *IEEE Trans. Comput.*, vol. C-35, no. 8, pp. 677-691, August 1986, with the exception that the reduction rule has been replaced with rule-(a) above while the sharing rule remains the same and, obviously, the number of children has been extended to N. Note that the GPDD reduces to the functional decision diagram (FDD) over GF(2). It also has integer interpretation as TED.

Figures 5A, 5B, 5C:
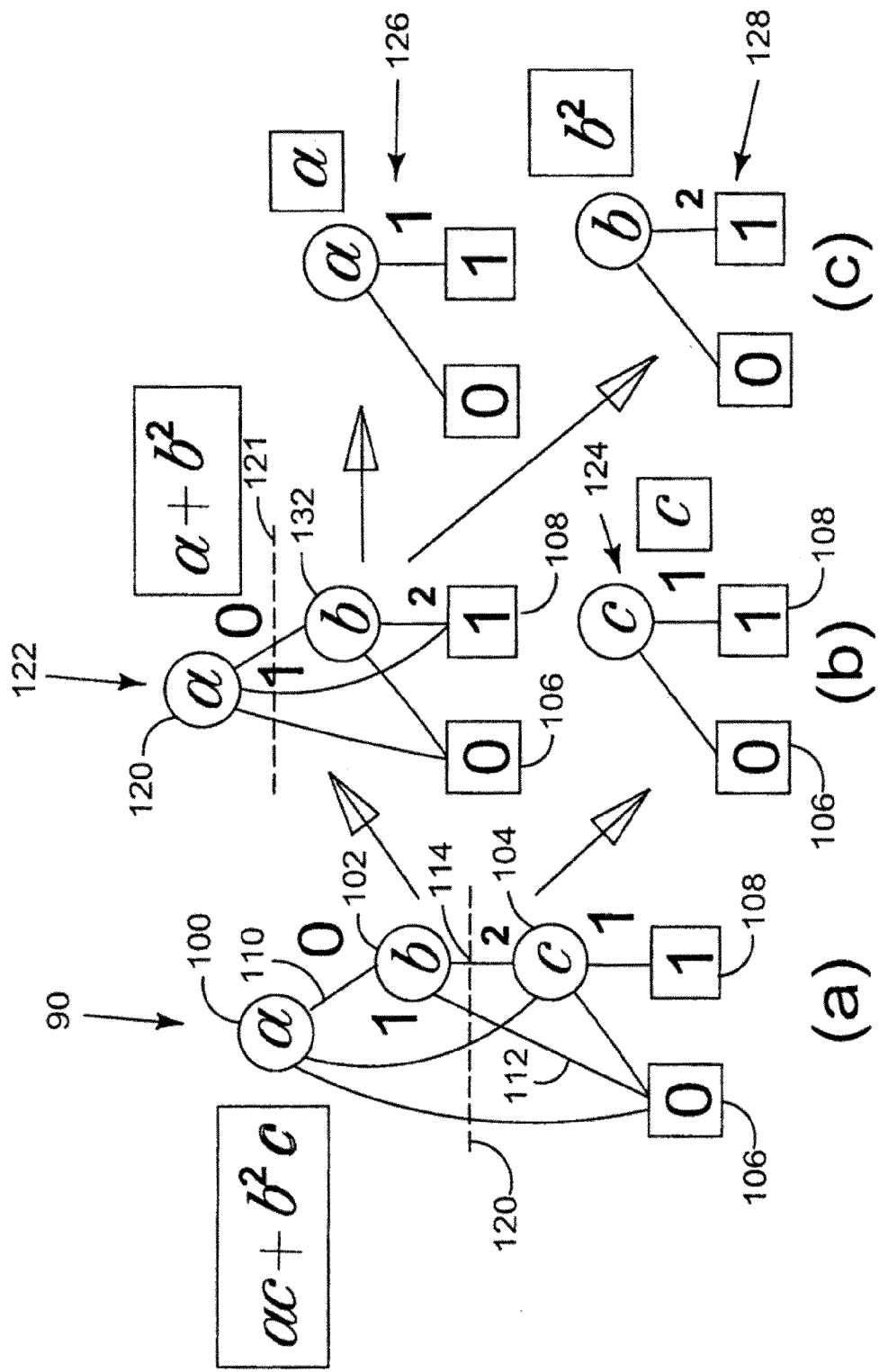
FIG. 5 is a reduced and shared Galois Polynomial Decision Diagram.

FIG. 5(a) shows a reduced and shared GPDD 90 for the polynomial $f(a,b,c) = ac + b^2c$ in GF(4) in 0-polarity with three internal nodes 100, 102, 104, denoting a, b and c respectively, and two terminal nodes 106 and 108 denoting 0 and 1 respectively. Each internal node 100, 102, 104 has four children (the other two internal nodes and the external nodes 106, 100). The edges 110, 112 114 are labeled 0 to 3. However edges terminating at the 0 terminal node 106 are not labeled.

At step S60 the SGPDD is decomposed and factorized to form a netlist by finding cuts within the SGPDD. A cut is a partitioning of the nodes in the SGPDD into two sets T and B, where T contains internal nodes and the root and B contains external, internal, and the last nodes, i.e. internal nodes which have the external nodes as their children. A cut passes through an SGPDD horizontally and does not cross an edge more than once. Effectively a cut can factorize an SGPDD realizing a function $f$ in $GF(2^m)$ as $f = D \cdot Q + R$. Once the cuts have been made the computer 14 can construct an expression DAG based multiple output shared netlist. The constructed netlist constitutes two types of nodes: internal nodes which can either be $GF(2^m)$ adders or multipliers, or external nodes which can only be constants and variables in $GF(2^m)$. The internal nodes can have two children.

Given a variable x and a GPDD for a function $f$, there are two types of decomposition possible, (i) multiplicative, which represents $f$ as $f = X \times Y$, and (ii) additive, which represents $f$ as $f = W + Z$. Here X, Y, W, and Z are GPDDs. To perform a decomposition a cut is performed above the nodes representing x. Let $v_x$ be a node representing x. To obtain the multiplicative decomposition all the paths in the original GPDD from nodes above the cut leading to $v_x$ are reconnected to the terminal node 1 and the result is reduced. This gives X. Y is simply the GPDD rooted at $v_x$. To obtain the additive decomposition all the paths in the original GPDD from nodes above the cut leading to $v_x$ are reconnected to the terminal node 0 and the result is reduced. This gives W. Z is obtained by reconnecting all the paths from nodes above the cut that do not pass through $v_x$ to the terminal node 0 and reducing the result.

The following example demonstrates the basic idea. In the GPDD 90 of FIG. 5(a) the cut 120 is shown with the horizontal broken line above the node 104(c). Note that cuts can also be made above node 102(b). However the cut above 104(c) has been made because of a specific reason. Here the node 104(c) is a dominator node, i.e. all paths ending in the terminal x node (in this case x=1) passes through node c. Given a dominator node v, v can be trivially factored out of a GPDD by reconnecting all the paths leading to v to the terminal node 1 and detaching the subgraph rooted at v as another GPDD. This results in a multiplicative decomposition over $GF(2^m)$. After cutting the GPDD, each of the component is reduced. Doing so for GPDD 90 results in two GPDDs 122, 124 shown in FIG. 5(b) While GPDD 124 in FIG. 5(b) cannot be decomposed further, the GPDD 122 can be decomposed as two GPDDs 126 and 128 one rooted at node 130(a), and the other rooted at node 132(b) (FIG. 7(c)). Here the cut 129 is performed above node 132(b), which results in an additive decomposition over $GF(2^m)$. The additive decomposition is performed as follows: All the paths leading to node 132(b) are reconnected to terminal node 106(0), which results in GPDD 126 rooted at node 130(a) after reduction. Again all the paths passing around node 132(b) are reconnected to the terminal node 106(0), which results in the GPDD128 rooted at node 132(b) after reduction. These nodes are not further decomposed, but instead added to the netlist as $c \times (a+b^2)$, which requires one multiplier and one adder over $GF(2^m)$. The exponent $b^2$ can be implemented in two ways: either using an additional multiplier for the exponentiation, or using an m input m-output look-up table (LUT) since we are dealing with $GF(2^m)$. Computer 14 can do either depending on which option is given.

Figure 6:
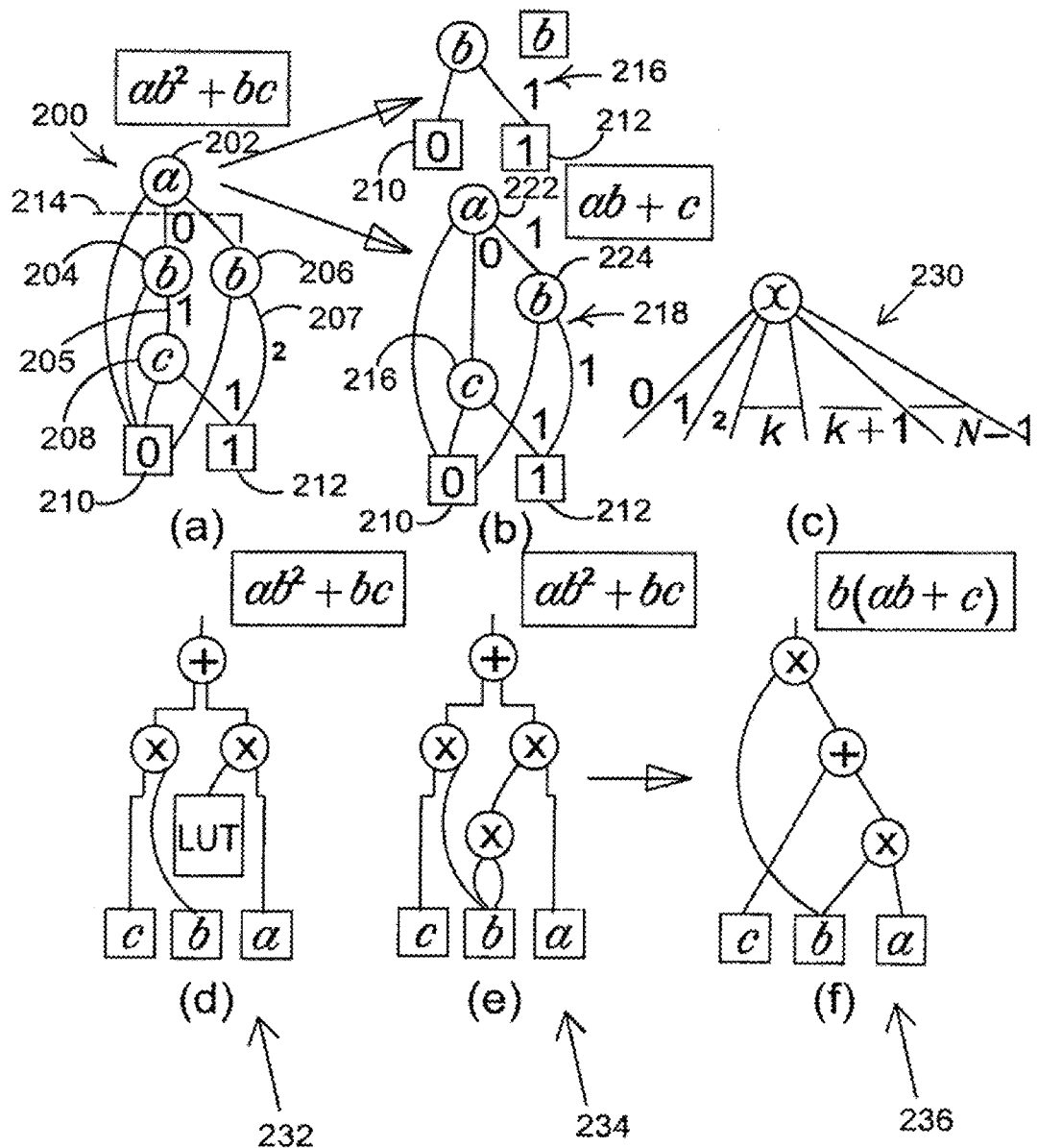
FIG. 6 is a second Galois Polynomial Decision diagram.

A more general case appears in FIG. 6 as GPDD 200. Here the function considered is $ab^2+bc$. Decomposition of expressions like this require the exponent to be dealt with. FIG. 6(b) shows how a multiplicative decomposition is carried out if the cut 203 is performed above the nodes 204, 206(b). First the exponent of the term to be factored out is determined, which in this case is 1 (since, $b=b^1$). Now the exponents corresponding to the edges of the nodes 204, 206 representing b is reduced by 1, which in effect implies that the 1-edge 205 of the 210 node 204 is replaced with a 0-edge while the 1-edge 205 is reconnected to the 0 terminal node 210. The 2-edge 207 of the node 206 is replaced with a 1-edge, while the 2-edge is reconnected to the 0 terminal node 210. Reduction of this GPDD200 results in GPDD218 of FIG. 8(b), while GPDD 216 corresponds to the factored out variable b.

In general given a GPDD 230 rooted at node x as shown in FIG. 8(c), if we want to factor out the term $x_k$, we first need to perform an additive decomposition about $x_k$ to obtain two GPDDs as $(1+x+x^2+\ldots+x^{k-1})+(x^k+x^{k+1}+\ldots+x^{N-1})$: one representing $1+x+x^2+\ldots+x^{k-1}$, and the other representing $x^k+x^{k+1}+\ldots+x^{N-1}$. The term $x^k$ can be factored out using a multiplicative decomposition from the second GPDD as outlined in the previous paragraph. Although decomposition in this manner is possible, in the preliminary version of our tool we perform factorization of exponents on the netlist which we obtain by using a fast greedy heuristic algorithm as outlined in FIG. 9.

```
1  Algorithm DecompGpdd{
2      Let NodeQ be a queue initially empty;
3      Let root be the root of the GPDD;
4      Let EtRoot be the root of the netlist;
5      Add root to the netlist and push root on to NodeQ;
6      do{
7          Remove head of NodeQ and assign to root;
8          Construct parent list of root;
9          if(ParentList > 0){
10             Q = node with the min/max parents;
11             D = AssignPassAroundZ(Q);
12             Reconnect all edges in D leading to Q to 1;
13             R = AssignPassThroughZ(Q);
14             D = reduce(D);
15             R = reduce(R);
16             Add Q, D, and R to the netlist;
17             Push Q, D, and R on to NodeQ;
18         }
19     }while(NodeQ is not empty);
20     EtRoot = optimize(EtRoot);
21 }
```

The algorithm decomposes a function $f$ as $f=D \cdot Q+R$. In Line 8 list of parents is computed for the GPDD rooted at root. Lines 10-17 are executed for nodes with at least one parent. Line 10 selects the node with the least or most number of parents, depending on which option is given. If the minimum number of parents is selected, then for multiplier circuits the invention results close to hand-optimized multipliers in $GF(2^m)$, e.g. the Mastrovito multipliers. Also, the invention produces good results for polynomials with repeated multiplication and exponentiation. For other circuits such as parallel integer adders selecting the maximum number of parents produces better results. This heuristic is based on the fact that with integer adders significant factorization is possible, which benefits from initially factoring out nodes with a high degree of sharing.

The cut is performed above the node Q. Lines 11 and 13 perform additive decomposition by reconnecting all paths coming from nodes above the cut not leading to (Line 11) and leading to (Line 13) Q to the zero terminal node. Line 12 performs multiplicative decomposition. These steps are repeated for each of the components, Q, D, and R. Line 20 performs an efficient netlist optimization as outlined below. No assumption is made regarding the word-size or the polarity, so the process will work for any value of m.

We also select the cuts for optimizing the overall propagation delays. For example given a GPDD for $f(x_1,x_2,\ldots,x_n)=x_1+x_2+\ldots+x_n$ selecting the nodes in the GPDD for cutting on a first-come first-served basis can generate the netlist as $(\ldots((x_1+x_2)+x_3)\ldots+x_n)$, which will result in a cascade of gates. However if the cuts are selected more cleverly, e.g. from the middle of the DAG, then we can generate the netlist as a balanced tree of gates: $(x_1+x_2)+(x_3+x_4)+\ldots+(x_{n-1}+x_n)$. Clearly the balanced tree will have less overall propagation delay compared to the cascaded form.

FIG. 5 shows the decomposition obtained from the GPDD 90 of FIG. 5(a) using this algorithm. FIG. 6(d) (exponent realized with LUT) and (e) (exponent realized with repeated multiplication) shows the resulting netlist after decomposing the GPDD 300 FIG. 8(a).

At step S62 the net list (normally resulting from step S60) is first factorized then optimized. Structural factorization of the net list constituting only two input adders and multipliers is found to work well in conjunction with the cut based decomposition.

To factorize the net list Common factors are determined by walking through chains of multipliers following chains of adders. A chain of adders is a non-empty ordered list of adders $\langle A_i, A_{i+1}, \ldots, A_{i+r} \rangle$ such that $A_i$ forms a chain if r=0; otherwise $A_{j+1}$ appears as one of the inputs to $A_j$ for $i \leq j < i+r$. A chain of multipliers is an ordered list of multipliers $\langle M_k, M_{k+1}, \ldots, M_{k+s} \rangle$ such that $M_{j+1}$ appears as one of the inputs to $M_j$ for $k \leq j < k+s$. A chain of multipliers can be empty, in which case a term (i.e. a node u or a subgraph rooted at u) is considered as a chain. Let $C_{A_1}=\langle A_i, A_{i+1}, \ldots, A_{i+r} \rangle$ and $C_{A_2}=\langle A_j, A_{j+1}, \ldots, A_{j+s} \rangle$ be two chains of adders. Let $C_{M_1}=\langle M_k, M_{k+1}, \ldots, M_{k+t} \rangle$ and $C_{M_2}=\langle M_l, M_{l+1}, \ldots, M_{l+w} \rangle$ be two chains of multipliers. Let $M_k$ and $M_l$ be one of the inputs to $A_{i+r}$ and $A_{j+s}$ respectively. Let X be a subgraph rooted at X such that X appears as one of the inputs to $M_{k+t}$ and $M_{l+w}$. $A_i=A_j$, then X is factorizable.

Figure 7:
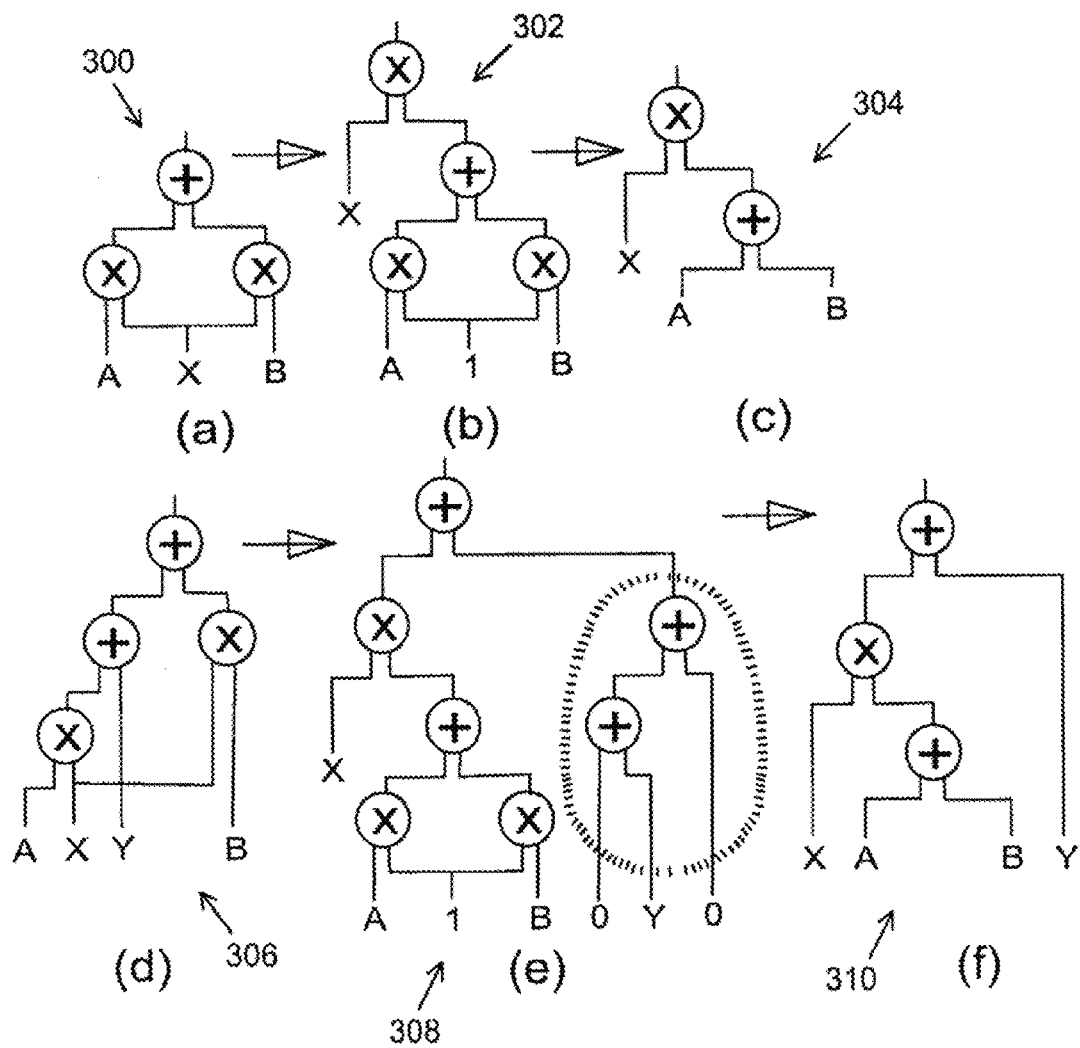
FIG. 7 depicts factorization of a netlist in a manner according to the invention.

The factorization is carried out as illustrated in FIG. 7. FIG. 7(a) shows the structure 300 (AX+BX) which can be factored as X(A+B) as shown in FIGS. 7(b) and (c). FIG. 7(d) shows a more general structure of the form Z=((AX+Y)+BX). Clearly X is factorizable. To factorize X Z is restructured as Z=((AX+BX)+Y) (FIG. 10(e)) and then the factorization is carried out as Z=((X(A+B))+Y) (FIG. 10(f)). The structure within the circle in FIG. 10(e) is the network of FIG. 10(d) after its pointers have been readjusted. After restructuring the circuits, the netlist optimization technique described below is applied to obtain the final circuits. This type of restructuring allows optimization of adders also, e.g. given W=((X+Y)+X) after restructuring and optimization we get W=(X(1+1))+((0+Y)+0)=Y. The factorization is carried out based on unique paths. This allows correct factorization of terms with exponents. For example factorizing the netlist 234 of FIG. 6(e) yields the netlist 236 of FIG. 6(f). This result is the same as decomposing the GPDD 200, 216, 218 shown in FIGS. 6(a) and (b). The algorithm for factorization proceeds by trying out all possible factorizations, and only stops when there are no more terms, which can be factored out. Factors are selected on a first come first-served basis. Again no assumption regarding the word-size or the polarity has been made, i.e. the same approach works for bit-level as well as word-level circuits in any polarity.

The original polynomials can be constructed from the netlists obtained after decomposing their GPDDs or after decomposition followed by factorization: (i) Traverse the netlists from the external (variable or constant) nodes towards the root node, i.e. from the inputs to the outputs of the netlists in the topological order, (ii) construct the expressions for each node successively, (iii) the expression corresponding to the root node will correspond to the polynomial from which the netlist was constructed. For example considering the netlist 236 in FIG. 6(f) if we visit this netlist from the inputs to the outputs, this would give us the expression $(b \cdot a+c) \cdot b=ab^2+bc$, which is the original polynomial.

Also during step S62 the factorized net list is optimized. The netlist is optimized using an efficient optimization algorithm as follows. Netlists are processed recursively from the external (i.e. variable or constant) nodes towards the root node, i.e. in the topological order. Each node is visited exactly once. For each node u the following is done. If u is already processed then its reference is returned so that it can be shared; otherwise its information is stored in a hash table for sharing. This step is necessary for sharing of hardware resources. If u is an internal (i.e. $GF(2^m)$ multiplier/adder) node, then let $v_0$ and $v_1$ be its two children. If both $v_0$ and $v_1$ are constants then, replace u with $v_0$ op $v_1$, where op is either addition or multiplication over $GF(2^m)$, i.e. perform constant propagation. Replace u with $v_i$ (i ∈ {0,1}), if $u=v_i \times 1$ or $u=v_i+0$. Replace u with 0, if $u=v_i \times 0$ or $u=v_i+v_i$. This algorithm can be shown to be optimal w.r.t. two input addition and multiplication over $GF(2^m)$ under a fixed netlist transformation. Also note that no assumption is made regarding the polarity or the word-sizes, i.e. it can be applied to bit-level (GF(2)) as well as word-level (m>1) correctly with either repeated multiplication or LUT based exponentiation and in any polarity. This algorithm can be applied for single as well as multiple output functions.

For example given the netlists 302 and 308 of FIGS. 7(b) and 7(e) this algorithm will yield the netlists 304 and 310 respectively.

At step S70 it is determined if word level analysis is required (m>1). if it then the world-level blocks are synthesized with binary logic element or LUTs. The steps 50 becomes a two-pass process for m>1. During the first pass the polynomials are synthesized and optimized at the m-bit word-level over $GF(2^m)$. During the second pass the basic elements such as the adders, multipliers, and exponentiation circuits are resynthesized with gate/logic level elements and the whole netlist is optimized again at the gate level over GF(2). The computer 14 need not have assumed anything regarding word-sizes during each of the passes, i.e. the same approach works for both gate/bit- and word-level netlists. Hence it provides with a unified framework. Since the netlists are assumed to constitute adders and multipliers with 2-inputs only, this type of structure provides with the finest grain optimization possible over a given m.

Multipliers and exponentiation circuits over $GF(2^m)$ can be realized in the bit parallel fashion with logic gates, or with 2m-input m-output and m-input m-output binary look-up tables (LUTs) respectively. At step S 72 it is determined by computer 14 whether some of these components of the polynomials are realized with LUTs, and so it returns to step S54 to compute the coefficients over GF(2) from the LUTs. If instead these components are realized with presynthesized gate-level macro blocks (cells), then computer 14 proceeds to step S66 to perform gate level netlist factorization and optimization only.

Exponentiation is carried out in two ways: (i) using the repeated multiplication rule, (ii) using LUTs, depending on which option is given. If rule (i) is specified, then exponents are generated using four different heuristics depending on which option is given: (1) balanced tree of multipliers, e.g. given $5x^8$ a balanced tree of multipliers is generated for the complete operation, (2) the actual exponent is a balanced tree, but terms like $5x^8$ are carried out using one additional multiplier as $5 \times x^8$, (3) square and multiply, (4) square and multiply incrementally, e.g. given $x^4$, $x^5$ and $x^{11}$, generate $x^4$ using square and multiply, $x^5=x^4 \times x$ and $x^{11}=x^5 \times x^6$, where $x^6=x^5 \times x$. The idea behind these heuristics is to allow different typed of sharing from which factorization can benefit.

If the LUT option is given, then polynomials of the form $p(x)=\Sigma_{i=0}^{2^m-1} c_i x^i$ where $c_i \in GF(2^m)$, are generated as a single m-input m-output LUT. For example given an expression $a^3(\beta b^9+b)+c(\beta b^9+b)$ in GF(16), it is first factored as $(\beta b^9+b)(a^3+c)$. Then the result is implemented using two 4-input 4-output LUTs, one for each $\beta b^9+b$ and $a^3$, one multiplier and one adder over GF(16)

Owing to the canonic nature of the DAGs for storing the coefficients the proposed technique is stable and independent of the starting point if the designs are initiated from step S52. This is a major advantage over many industrial tools, which can produce different results for the same polynomial if the initial spec is altered. Because of this the resulting netlist will always be structurally identical for polynomials with identical functionality. Therefore the invention can be used to verify hardware. For example if we have two netlists $N_1$ and $N_2$, both generated by the invention, where $N_1$ is generated from polynomial P. To verify that $N_2$ is functionally equivalent to $N_1$, and hence realizes P, we only need to check if $N_2$ structurally matches $N_1$. This can be done on a node-by-node match between the two netlists (i.e. test for graph isomorphism) in linear time in the number of nodes. Alternatively if we have two netlists $N_1$ and $N_2$ obtained from polynomials $P_1$ and $P_2$ respectively, then if $N_1$ is isomorphic to $N_2$, then we can conclude that $P_1=P_2$. If the netlists are saved as VHDL files, then the equivalence of $N_1$ to $N_2$ can be tested simply by matching their VHDL files line-by-line, e.g. using the 'diff' tool in Linux/UNIX. Hence the proposed technique can make it easier to verify the hardware designed from the polynomials.

Circuits produced by the invention such as circuit production system 10 have a significantly smaller area and/or have significantly less delay and/or consume significantly less power than those made by conventional methods. Additionally the circuits produced are highly testable circuits for stuck-at faults.

These results are now demonstrated by the experimental results below.

The algorithms in the below examples were implemented in C++ (Gnu C++ 3.2.2-5) on a computer with 640 MB RAM and a 600 MHz Athlon processor running RedHat Linux with kernel-2.4.20-43.9. The Synopsysr design compiler was run on a dual processor Pentium 4 Linux machine with 2 GB RAM and kernel-2.4.21-20.EL. The benchmarks were stored as two-level AND-OR PLAs to enable it to be demonstrated how effective techniques of the invention can be in optimizing area, power, and delay. Also, the Synopsysrdesign compiler understands this format. The PLAs were read into SMODDs, and an algorithm of the invention was applied). The SGPDDs were constructed in the natural order of the variables during then synthesis process. After optimization, the results were saved in the VHDL format, which were passed to the Synopsysr design compiler (power was estimated with the Synopsysr power compiler). The PLAs were also passed directly to the Synopsysr compiler for it to optimize without the aid of the new technique. A combination of C++ codes and perl scripts were used to generate the test cases and then execute the tools with the different test cases, word sizes, and primitive polynomials. Unless otherwise specified, the tool assumes the following primitive polynomials by default for generating the fields: (2,7), (3,11), (4,19), (5,37), (6,67), (7,137), (8,285). Here the first number m in the ordered pair (m,d) is the bit width and determines the field size, i.e. GF($2^m$), and the second number d is the decimal representation of the primitive polynomial. It is also possible to specify any other word sizes and valid primitive polynomials as command line options. We have used the basic command: compile for the Synopsysr compilers, i.e. without any constraints. We have also compared with the command: compile-map effort high-area effort high with a virtual clock. In the second case the compiler reported a higher overall chip area, without affecting the area improvements brought about by the techniques.

Multipliers Over GF($2^m$):

The table below shows results for GF($2^m$) multipliers ($2 \leq m \leq 8$) for all the 51 primitive polynomials in the 0.18 micron CMOS technology.

TABLE I 2-8 BIT GF($2^m$) MULTIPLIERS WITH ALL 51 PRIMITIVE POLYNOMIALS.

| Word size | Prim Poly | SMODD (nodes, paths) | SGPDD (nodes, paths) | Synopsys ® only (area, delay, power) | Proposed Technique (a, m) | Proposed Technique (area, delay, power) | Testing (Num. Vectors) Synopsys ® | Testing (Num. Vectors) SIS [19] |
|---|---|---|---|---|---|---|---|---|
| 2 | 7 | (10, 8) | (7, 5) | (112.9, 0.3, 0.1) | (3, 4) | (112.9, 0.3, 0.1) | 7 | 7 |
| 3 | 11 | (31, 39) | (14, 12) | (412.9, 0.7, 0.5) | (8, 9) | (277.4, 0.7, 0.5, 0.3) | 8 | 9 |
|   | 13 | (31, 39) | (14, 13) | (403.2, 0.9, 0.5) | (8, 9) | (287.1, 0.7, 0.4) | 9 | 8 |
| 4 | 19 | (82, 160) | (23, 22) | (1283.8, 1.1, 1.7) | (15, 16) | (537.2, 0.6, 0.6) | 11 | 10 |
|   | 25 | (82, 160) | (23, 26) | (977.4, 1.4, 1.2) | (15, 16) | (522.5, 1.0, 0.7) | 11 | 10 |
| 5 | 37 | (201, 605) | (35, 36) | (2383.7, 2.0, 3.1) | (25, 25) | (838.7, 0.9, 1.1) | 13 | 13 |
|   | 41 | (201, 605) | (35, 38) | (2354.7, 1.9, 2.9) | (25, 25) | (841.9, 0.9, 1.2) | 12 | 13 |
|   | 47 | (201, 605) | (42, 51) | (5951.2, 2.5, 7.3) | (32, 25) | (970.9, 1.2, 1.4) | 15 | 14 |
|   | 55 | (201, 605) | (41, 46) | (5260.9, 2.7, 6.3) | (31, 25) | (967.7, 1.1, 1.4) | 13 | 14 |
|   | 59 | (201, 605) | (41, 50) | (4909.3, 2.7, 6.5) | (31, 25) | (993.5, 1.4, 1.4) | 14 | 14 |
|   | 61 | (201, 605) | (42, 49) | (5015.8, 2.4, 6.6) | (32, 25) | (977.4, 1.3, 1.4) | 16 | 15 |
| 6 | 67 | (472, 2184) | (47, 51) | (6606.0, 2.9, 8.5) | (35, 36) | (1206.4, 1.0, 1.6) | 18 | 13 |
|   | 91 | (472, 2184) | (58, 83) | (18047.2, 5.7, 22.9) | (46, 36) | (1387.0, 1.8, 2.1) | 16 | 14 |
|   | 97 | (472, 2184) | (47, 71) | (5164.2, 2.8, 7.2) | (35, 36) | (1270.9, 2.5, 1.9) | 21 | 13 |
|   | 103 | (472, 2184) | (57, 74) | (9886.4, 3.6, 12.4) | (46, 36) | (1377.3, 1.5, 2.0) | 15 | 12 |
|   | 109 | (472, 2184) | (59, 73) | (11118.6, 3.9, 14.5) | (47, 36) | (1367.7, 1.4, 2.0) | 14 | 14 |
|   | 115 | (472, 2184) | (57, 75) | (15657.0, 4.4, 20.0) | (46, 36) | (1438.6, 1.4, 2.1) | 15 | 17 |
| 7 | 131 | (1079, 7651) | (62, 70) | (30866.1, 7.7, 39.1) | (48, 49) | (1699.9, 1.3, 2.4) | 20 | 15 |
|   | 137 | (1079, 7651) | (64, 73) | (30356.5, 8.3, 39.9) | (50, 49) | (1709.6, 1.6, 2.5) | 19 | 18 |
|   | 143 | (1079, 7651) | (81, 118) | (33375.6, 8.0, 40.3) | (67, 49) | (1925.7, 1.9, 3.0) | 18 | 14 |
|   | 145 | (1079, 7651) | (64, 76) | (33469.1, 8.1, 42.3) | (50, 49) | (1703.1, 1.7, 2.5) | 20 | 17 |
|   | 157 | (1079, 7651) | (79, 120) | (35020.6, 7.4, 42.7) | (65, 49) | (1964.4, 2.1, 3.1) | 26 | 14 |
|   | 167 | (1079, 7651) | (79, 118) | (34978.7, 7.7, 39.7) | (65, 49) | (1964.4, 1.7, 3.2) | 20 | 16 |
|   | 171 | (1079, 7651) | (78, 102) | (39023.2, 8.5, 49.1) | (64, 49) | (1906.3, 1.4, 2.9) | 23 | 16 |
|   | 185 | (1079, 7651) | (80, 104) | (34797.9, 8.7, 42.1) | (66, 49) | (2003.1, 1.4, 3.0) | 23 | 16 |
|   | 191 | (1079, 7651) | (89, 131) | (34843.1, 8.8, 41.0) | (75, 49) | (2077.3, 1.8, 3.2) | 20 | 16 |
|   | 193 | (1079, 7651) | (62, 105) | (30321.0, 8.0, 38.8) | (48, 49) | (1725.7, 3.2, 2.7) | 21 | 13 |
|   | 203 | (1079, 7651) | (78, 114) | (33875.6, 8.0, 42.0) | (64, 49) | (1922.5, 1.5, 3.0) | 20 | 21 |
|   | 211 | (1079, 7651) | (78, 120) | (33440.1, 8.2, 40.3) | (64, 49) | (1935.4, 1.7, 3.1) | 18 | 15 |
|   | 213 | (1079, 7651) | (79, 129) | (33488.5, 8.0, 38.9) | (65, 49) | (2009.6, 1.8, 3.3) | 21 | 13 |
|   | 229 | (1079, 7651) | (81, 123) | (34578.6, 8.2, 41.3) | (67, 49) | (1980.5, 1.8, 3.2) | 17 | 12 |
|   | 239 | (1079, 7651) | (86, 114) | (34123.9, 9.9, 41.5) | (72, 49) | (2041.8, 1.6, 3.1) | 19 | 14 |
|   | 241 | (1079, 7651) | (75, 99) | (32298.3, 8.7, 36.7) | (61, 49) | (1899.9, 1.6, 3.0) | 20 | 19 |
|   | 247 | (1079, 7651) | (86, 118) | (36704.1, 7.2, 45.0) | (72, 49) | (2106.3, 1.6, 3.2) | 19 | 14 |
|   | 253 | (1079, 7651) | (88, 109) | (33782.0, 8.3, 41.3) | (74, 49) | (2106.3, 2.0, 3.2) | 20 | 16 |
| 8 | 285 | (2422, 26240) | (103, 150) | (141689.3, 18.8, 130.9) | (87, 64) | (2628.9, 1.6, 4.2) | 26 | 14 |
|   | 299 | (2422, 26240) | (101, 160) | (152603.3, 14.6, 125.7) | (85, 64) | (2609.5, 1.7, 4.1) | 22 | 17 |
|   | 301 | (2422, 26240) | (100, 141) | (132595.5, 15.0, 125.4) | (84, 64) | (2580.5, 1.5, 4.0) | 17 | 15 |
|   | 333 | (2422, 26240) | (100, 160) | (140896.3, 15.2, 129.3) | (84, 64) | (2574.0, 2.0, 4.1) | 25 | 18 |
|   | 351 | (2422, 26240) | (116, 162) | (135107.6, 17.9, 121.5) | (100, 64) | (2757.9, 1.5, 4.3) | 24 | 17 |
|   | 355 | (2422, 26240) | (104, 165) | (143195.4, 17.4, 126.0) | (88, 64) | (2612.7, 1.8, 4.2) | 21 | 18 |

TABLE I-continued 2-8 BIT GF($2^m$) MULTIPLIERS WITH ALL 51 PRIMITIVE POLYNOMIALS.

| Word size | Prim Poly | SMODD (nodes, paths) | SGPDD (nodes, paths) | Synopsys ® only (area, delay, power) | Proposed Technique (a, m) | (area, delay, power) | Testing (Num. Vectors) Synopsys ® | SIS [19] |
|---|---|---|---|---|---|---|---|---|
| | 357 | (2422, 26240) | (100, 158) | (144472.7, 14.8, 133.5) | (84, 64) | (2548.2, 1.5, 4.0) | 25 | 18 |
| | 361 | (2422, 26240) | (104, 170) | (135227.9, 16.3, 125.6) | (88, 64) | (2628.9, 1.7, 4.2) | 27 | 17 |
| | 369 | (2422, 26240) | (105, 153) | (132405.8, 17.6, 130.2) | (89, 64) | (2722.4, 1.9, 4.3) | 30 | 16 |
| | 391 | (2422, 26240) | (95, 155) | (130577.4, 15.9, 126.5) | (79, 64) | (2441.8, 2.2, 3.8) | 18 | 16 |
| | 397 | (2422, 26240) | (103, 158) | (139992.8, 14.4, 122.3) | (87, 64) | (2532.1, 2.0, 4.0) | 24 | 16 |
| | 425 | (2422, 26240) | (110, 181) | (141879.6, 15.6, 118.9) | (94, 64) | (2690.2, 2.0, 4.3) | 23 | 15 |
| | 451 | (2422, 26240) | (95, 152) | (139612.7, 17.6, 123.9) | (79, 64) | (2493.4, 1.8, 3.9) | 23 | 13 |
| | 463 | (2422, 26240) | (106, 160) | (141228.2, 17.8, 122.9) | (90, 64) | (2661.1, 1.9, 4.1) | 24 | 16 |
| | 487 | (2422, 26240) | (108, 155) | (150703.6, 16.7, 138.8) | (92, 64) | (2632.1, 1.9, 4.1) | 20 | 16 |
| | 501 | (2422, 26240) | (120, 174) | (129935.6, 16.0, 119.2) | (104, 64) | (2906.3, 2.3, 4.7) | 22 | 17 |

Column 2 represents the primitive polynomials, while column 5 represents the area, delay, and power reported by the Synopsysr design compiler without the aid of the new techniques. The column with the heading "New Technique" shows the result of applying the new technique first, and then applying the Synopsysr compiler on the resulting VHDL files. The letters 'a' and 'm' represent 2-input EXOR and AND gates respectively. Here area, delay, and power are in 10-6 mm2, nano seconds, and mW respectively. Power was estimated at 1.8V. Significant area, delay, and power reduction is observable (as much as 57 times for polynomial 487). Clearly the number of AND gates is m2 for all the cases. The number of EXOR gates varies from approximately m2-1 for trinomials, e.g. 19, 25, 37, 67, 131 to m2+k, where k is a constant, for pentanomials and polynomials with more than 5 terms. As compared with [29], which reports 2m2-1 2-input AND gates and 2m2-3m+1 EXOR gates, the new technique produced better results. In the 0.18 micron CMOS technology for the 8 bit multiplier this technique reports maximum area of 0.002906 mm2, whereas N. Itiev, J. E. Stine, and N. Jachimiec in Parallel Programmable FiniteField GF(2m) Multipliers In *Proc. IEEE Comp. Soc. Annual Symp. VLSI Emerging Trends (ISVLSI'04)*, pages 299-302, February 2004 reported 0.0128 mm2, i.e. about 4.4 times better (5.2 times better for polynomial 391).

Also, it reports about 2 times reduced delay. For the 4-bit case the new technique reports about 5.1 times better area.

Techniques of A. Halbutogullari and Cetin K. Koc, Mastrovito (Multiplier for General Irreducible Polynomials. *IEEE Trans. Comput.*, 49(5):503-518, May 2000); A. Reyhani-Masoleh and M. A. Hasan (Low Complexity Bit Parallel Architectures for Polynomial Basis Multiplication over GF(2m) *IEEE Trans. Comp.*, 53(8):945-959, August 2004); and J. L. Imana, J. M. Sanches, and F. Tirado (Bit Parallel Finite Field Multipliers for Irreducible Trinomials. *IEEE Trans. Comp.*, 55(5):520-533, May 2006) have reported only theoretical results, with m2 2-input AND gates and m2-1 (for trinomials) to m2+k EXOR gates depending on the number of terms in the polynomials and their positions, without any implementation. However we compared with the examples given by Halbutogullari and Koc and Reyhani-Masoleh and Hasan. Reyhani-Masoleh and Hasan reported 18 EXOR and 16 AND gates for the GF(24) multiplier in the primitive polynomial 25, whereas this technique reports 15 EXOR and 16 AND gates. As compared with Halbutogullari and Koc the new technique reported similar result for the polynomial 171 in GF(27). Note that Table I closely approximates the theoretical results reported by these techniques, despite the fact that the new technique is a heuristic synthesis algorithm for polynomials, whereas these techniques are designed only for hand synthesizing the multipliers in GF(2m). Columns 3 and 4 show the total number of nodes and paths required by the SMODD and SGPDD. The node count in the SMODDs was approximately doubling for each added bit, while the SGPDDs were increasing much more slowly. Also for the 7- and 8-bit multipliers the node count in the SMODDs was well over one order of magnitude higher than that in the corresponding SGPDDs. The last column of Table I shows the total number of test vectors required by the Automatic Test Pattern Generation (ATPG) tools in the Synopsysr compilers (TetraMAXr) and SIS to test the multipliers. The fault coverage was always 100% for stuck-at faults. We used the random pattern generation scheme of SIS (command: atpg-v3) for determining the number of test patterns with SIS. Note that the Synopsysr compilers seemed to map the AND-EXOR based VHDL formats to a network comprising elements from its technology libraries. For SIS the circuits were provided in the BLIF format, which constituted LUTs for each 2-input AND and EXOR gates. Note that we do not present any results for adders over GF(2m). Techniques of the invention can be used to easily synthesize adders optimally, i.e. with m 2-input EXOR gates.

Figure 9:
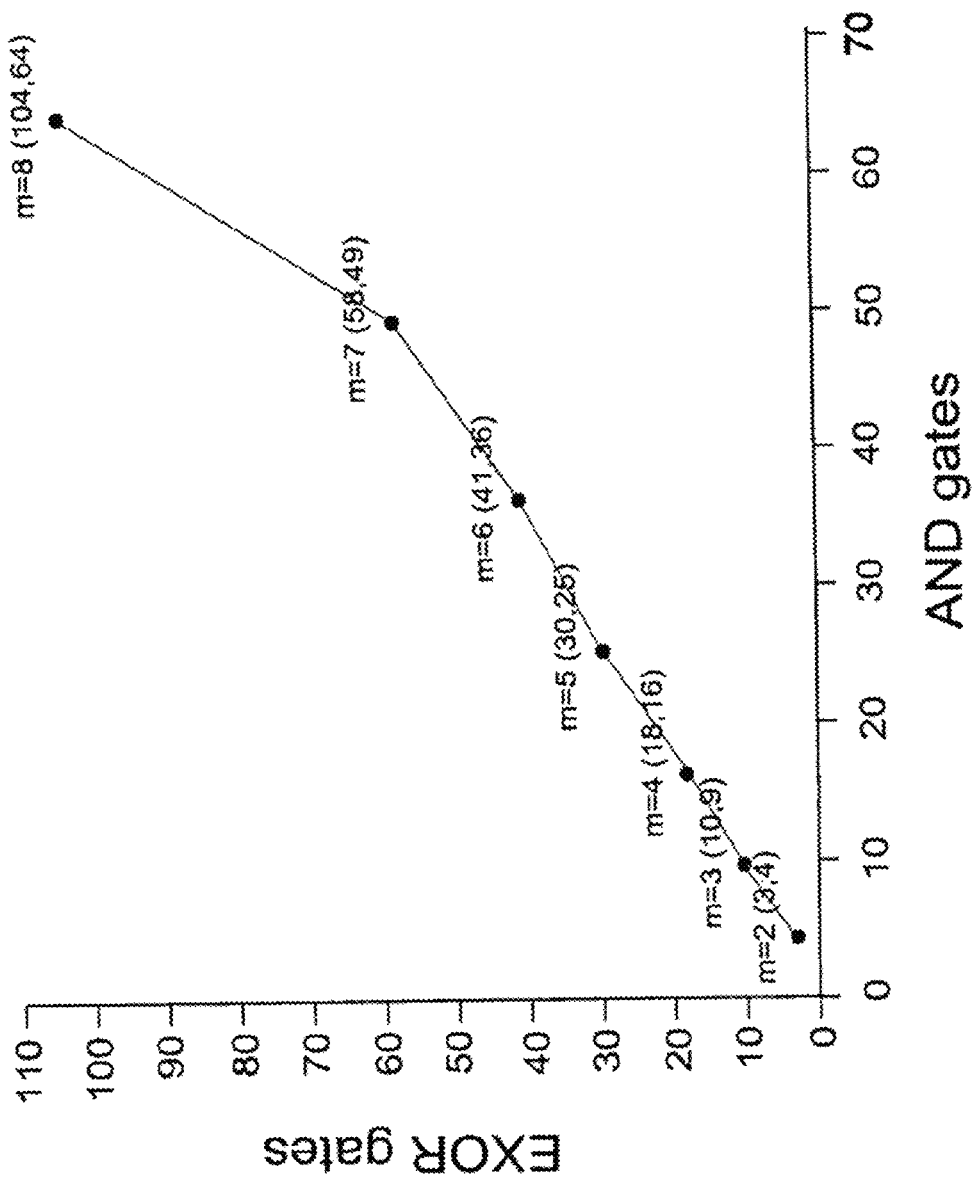
FIG. 9 is a Gate count for ab2 for AND gates against EXOR gates.

Exponentiation Over GF(2m):

In FIG. 9 there is shown the result of applying the technique for optimizing the term ab2 in GF(2m), where $2 \leq m \leq 8$. The total number of AND gates is exactly m2. The total EXOR gate count is approximately m2+m up to m=7. For m=8 the EXOR gate count worsens. Note that techniques such as those described by C. H. Liu, N. F. Huang, and C. Y. Lee (Computation of ab2 Multiplier in GF(2m) Using an Efficient Low Complexity Cellular Architecture. *IEICE Trans Fund. Electron. Comm. Comp. Sci.*, E83-A(12):2657-2663, 2000), which are tailored for hand synthesizing ab2, have reported total EXOR and AND gate counts of (m+1)2 each.

Figure 10:
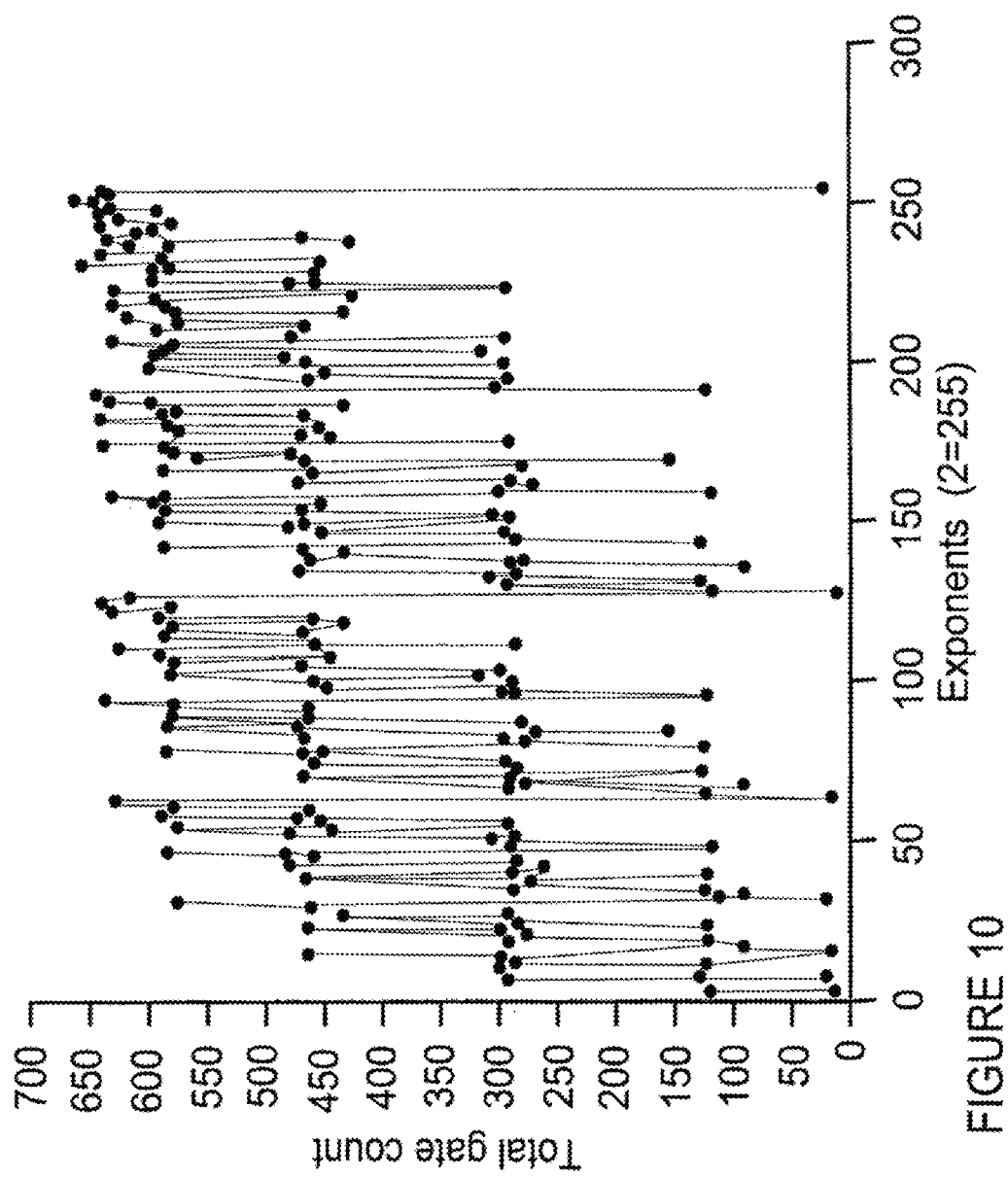
FIG. 10 is a graph of the variation of 2-input gates with exponent over GF(28)

FIG. 10 shows how the total 2-input gate count varies with the exponent xy, where $2 \leq y \leq 255$, over GF(28). There are distinct regions noticeable which seems to be repeated with the exponents. For exponents 2, 4, 8, 16, 32, and 128 only 2-input EXOR gates were required, with 11 being the minimum (for exponents 2 and 128) and 21 being the maximum (for exponent 32). The hardest exponent was 251, which required 410 and 251 2-input EXOR and AND gates respectively, i.e. 661 gates in total. Exponent 255 requires 14 2-input EXOR gates, and 9 2-input AND gates, which can be realized with a single 8-input OR gate. We have also applied the new technique on aby for $2 \leq y \leq 255$ in GF(28) at the gate-level. The minimum area is 148.7×10-6 mm2 for ab255, and the maximum area is 60902×10-6 mm2 for ab251. We do not compare all the cases produced by the Synopsysr compilers only, since for most of the cases it takes far too long without the aid of new technique, e.g. for ab79 the compiler was terminated after 51 hours. We can apply the Synopsysr compilers for certain cases, e.g. for ab68 it reported 790785×10−6 mm2, and 24.1 ns delay without the new techniques, whereas with the new technique it reported 11531×10−6 mm2 area and 3.58 ns delay, i.e. about 68 times area and nearly one order of magnitude delay improvement respectively. If the new technique is applied at the word level (8-bit word size), then for ab251 with b251 implemented as LUT the gate count reduces from 2280 EXOR, and 1275 AND gates down to a maximum of 497 EXOR and 315 AND gates. Here the multiplier and the LUT are minimized at the gate-level.

Integer Arithmetic:

Although this technique was initially intended for the polynomials over finite fields, we also tested its performance for other types of circuits, e.g. gate-level arithmetic circuits by modeling each output with a multivariate polynomial over GF(2).

The below table shows the results for gate level optimization of 2-9 bit parallel integer adders.

| Integer Adder | Synopsys ® only (area, delay, power) | Proposed technique (a, m) | Proposed technique (area, delay, power) |
|---|---|---|---|
| 2-bit | (119.3, 0.3, 115.7) | (4, 5) | (106.4, 0.4, 113.1) |
| 3-bit | (197.8, 0.7, 214.3) | (11, 6) | (216.1, 0.81, 241) |
| 4-bit | (274.2, 1.21, 301.8) | (17, 8) | (316.1, 1.08, 378.2) |
| 5-bit | (383.8, 1.22, 468.5) | (23, 10) | (416.1, 1.4, 515.8) |
| 6-bit | (493.5, 1.58, 590) | (29, 12) | (509.6, 1.72, 627.5) |
| 7-bit | (638.7, 1.61, 791.1) | (35, 14) | (609.3, 2.04, 752.8) |
| 8-bit | (687.0, 2.0, 809.4) | (41, 16) | (709.6, 2.38, 879) |
| 9-bit | (11877, 3.7, 13800) | (47, 18) | (809.6, 2.69, 1000) |

Figure 11:
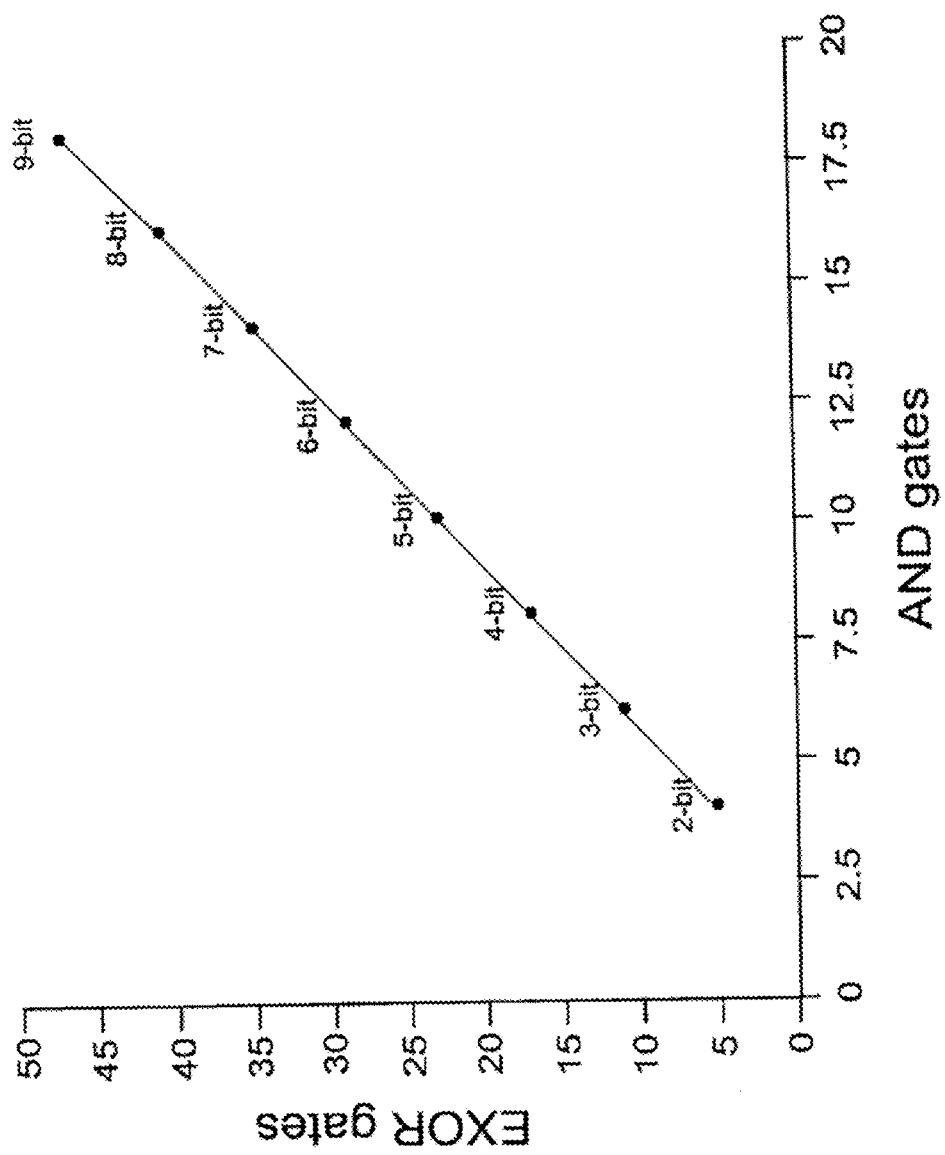
FIG. 11 is a Gate count for 2-9 bit integer adders for AND gates against EXOR gates.

Column 2 shows the results using only the Synopsysr design compiler. Columns 3-4 show the results obtained with the new technique first in conjunction with the Synopsysr compilers. Here area, delay, and power are in 10−6 mm2, nano seconds, and mW respectively. Column 2 represents the 2-input EXOR and AND gate counts as 'a' and 'm' respectively. Up to 8 bits the new technique does not bring any noticeable advantage. However for the 9-bit adder the new technique has improved the result by more than one order of magnitude. FIG. 11 shows that the adder scales linearly in terms of 2-input gate count with the new technique. For the integer multipliers we noticed mixed results. For the smaller multipliers it reported similar or worst results compared to the Synopsysr compilers. For the larger multipliers, e.g. 8-bit ones, it reported up to 25-35% area improvement. For example for the 8-bit integer multiplier we observed area, delay, and power of 447073.56 mm2, 23.14 ns, and 976.2 mW respectively with the new technique, whereas without the new technique we observed area, delay, and power of 698171.6 mm2, 20.55 ns, and 403.3 mW respectively. Note that in this instance the power has gone up with our technique, whereas the area has gone down.

Generic Polynomials—Bit Vs. Word-Level:

The table below shows the results for some sample multivariate polynomials.

| Field (k, pp) | Polynomial | Exp4 (a, m) | LUT (a, m, LUT) | Gate Level (a, m) |
|---|---|---|---|---|
| (6, 67) | $a^{13} + b^{11}$ | (1, 10) [(356, 360)] | (1, 0, 2) [(134, 83)] | (136, 83) |
| (6, 67) | $a^6b^7 + a^7b^{10}$ | (1, 11) [(391, 396)] | (1, 2, 4) [(289, 207)] | (1295, 631) |
| (6, 67) | $a^{59}b^{35} + a^{29}b^{63}$ | (1, 27) [(951, 972)] | (1, 2, 4) [(320, 247)] | (1300, 745) |
| (5, 37) | $a^{30}b^{29}c + b^{29}c^{17}$ | (1, 22) [(555, 550)] | (1, 2, 3) [(189, 154)] | (1238, 748) |

The polynomials have been synthesized at the word as well as at the gate-level. At the word-level, Exp4 and the LUT based techniques have been applied for the generation of exponents. The symbols 'k', 'pp', 'a' and 'm' represent the word size, primitive polynomial, total number of 2-input adders (EXOR gates in GF(2)) and multipliers (AND gates in GF(2)) respectively. The figures within '[ ]' represent the maximum number of 2-input EXOR and AND gates required to implement the adders, multipliers, and LUTs. This figure is obtained by synthesizing the LUTs at the gate level with the new technique, and then adding the total number of 2-input EXOR and AND gates required for the LUTs, adders, and multipliers (Table I). Clearly the LUT based algorithm is winning out, while Exp4 is in the second place. However LUTs suffer from exploding in size quite rapidly, unless they are saved in a DAG-based form, e.g. the BDD, as they are created. We noticed significant speed-up by incorporating Algorithm GfCoeffHs1 (FIG. 5), as compared to Algorithm CompBy-Path described by A. Jabir and D. Pradhan (MODD: A New Decision Diagram and Representation for Multiple Output Binary Functions. In *Des. Automat. Test. in Europe (DATE '04)*, pages 1388-1389, Paris, France, February 2004). For example, in the above table, Algorithm GfCoeffHs1 takes 0.63 and 129.23 seconds to compute the coefficients for the polynomials in rows 3 and 4 respectively. This figure is 22.51 and 1507.06 seconds respectively with Algorithm CompBy-Path, i.e. more than one order of magnitude speed-up with Algorithm GfCoeffHs1. The speed improvement is also better with the larger fields. k) Standard Benchmarks: We also tested it on standard benchmarks (gate-level), e.g. the IWLS'93 set. It produced good results for those cases which have arithmetic circuits built-in, e.g. for rd84, t481, alu4 it reported 2-input gate counts as (a,m): (21,21), (17,10), and (778,650) respectively. Note that in all the cases many 2-input EXOR gates were of the form 1+x, which is a single NOT gate, but still counted as an EXOR gate.

We also tried to compare with SIS executed with script.rugged described by E. M. Sentovich, K. J. Singh, C. Moon, H. Savoj, R. K. Brayton, and A. Sangiovanni-Vincentelli (Sequential circuit design using synthesis and optimization. In *Proceedings of the International Conference on Computer Design*, pages 328-333. IEEE Computer Society Press, October 1992). For m>5 SIS was taking a very long time to complete for the multipliers, exponentiation, and integer adder circuits and its execution had to be terminated. For the other cases the new technique reported better results. At the worst case we noticed about 20 mins for the entire synthesis process including the Synopsysr compilers with the new technique. On an average it was a few minutes.

Note that the technique of C. Files and M. Perkowski (New Multivalued Functional Decomposition Algorithms Based on MDDs. *IEEE Trans. CAD*, 19(9):1081-1086, September 2000) does not report any results on the polynomials over GF(2m). It also does not report any synthesis results, i.e. chip area, delay, or power. From a traditional logic synthesis point of view, it is generally believed that algebraic methods could be suitable for control circuits at the gate-level, although our approach, despite being entirely algebraic, shows very good results for arithmetic circuits as well.

The experimental results suggest that this technique can significantly reduce area, delay, and power (up to 68 times area, and significantly more than one order of magnitude delay and power). Also this technique can closely match techniques tailored for hand synthesizing circuits in GF(2m). Therefore we can conclude that if this technique is used in two-steps, on its own or in conjunction with existing techniques specifically tailored for synthesizing multipliers, exponentiators, etc. over GF(2m), then near optimal circuits can be designed for the polynomials over GF(2m). This technique can also produce 100% testable circuits for stuck-at faults, which require small number of vectors (approximately 2m) for testing. Also this technique is capable of producing structurally identical netlists for circuits with the same function, which are independent of the initial specification. This property of the new technique can help with fast verification of circuits synthesized with it.

The invention claimed is:

1. A Galois Field (GF) circuit production apparatus for fabricating a GF($2^m$) polynomial in a circuit, comprising:
    an input device for receiving a GF($2^m$) polynomial for which a circuit is desired;
    a processor and memory for producing a netlist representing the GF($2^m$) polynomial; and
    a Galois Field circuit fabricator for fabricating a circuit from a netlist that has chains of adders and chains of multipliers;
    wherein the processor and memory are configured to decompose a Galois Polynomial Decision Diagram (GPDD) and to factorize a first netlist corresponding to the GF($2^m$) polynomial, determining factors common to terms of the GF($2^m$) polynomial by passing through the chains of multipliers following the chains of adders and extracting the determined factors common to terms of the GF($2^m$) polynomial to generate a factorized netlist;
    wherein the circuit fabricator operably fabricates a circuit based on the factorized netlist produced by the processor; and
    wherein there is an optimization algorithm stored in the memory and the processor is configured to run the optimization algorithm on the factorized netlist to generate a second netlist and wherein the circuit fabricator operably fabricates a circuit based on the second netlist produced by the processor.

2. A Galois Field (GF) circuit production apparatus for fabricating GF($2^m$) polynomial in a circuit, comprising:
    an input device for receiving a GF($2^m$) polynomial for which a circuit is desired;
    a processor and memory for producing a netlist representing the GF($2^m$) polynomial; and
    a Galois Field circuit fabricator for fabricating a circuit from a netlist that has chains of adders and chains of multipliers;
    wherein the processor and memory are configured to decompose a Galois Polynomial Decision Diagram (GPDD) based on the GF($2^m$) polynomial by cutting nodes of the GPDD into sets, to reduce one or more of the area, power consumption, or delay of a circuit, and generate a first netlist;
    wherein the circuit fabricator operably fabricates a circuit from a netlist based on the first netlist;
    wherein the processor and memory are configured to factorize the first netlist corresponding to the GF($2^m$) polynomial, determining factors common to the terms of the GF($2^m$) polynomial by passing through the chains of multipliers following the chains of adders and extracting the determined factors common to terms of the corresponding to the GF($2^m$) polynomial to generate a factorized netlist; and
    wherein there is an optimization algorithm stored in the memory and the processor is configured to run the optimization algorithm on the factorized netlist to generate a second netlist and wherein the circuit fabricator operably fabricates a circuit based on the second netlist produced by the processor.

3. An apparatus according to claim 2, wherein the optimization algorithm processes recursively from a variable node or a constant node towards a root node, and/or for each GF($2^m$) multiplier/adder node, one or more of the following are carried out:
    if its two children are constants then, the GF($2^m$) multiplier/adder node value is replaced with the addition or multiplication over GF($2^m$) of its two children, if the GF($2^m$) multiplier/adder node is the GF($2^m$) multiplication of a child with 1 or the GF($2^m$) addition of a child with 0 then it is replaced with the value of that child, if the GF($2^m$) multiplier/adder node is the value of the child GF($2^m$) multiplied with 0, or the value of the child GF($2^m$) added to itself, the node value is replaced with 0, and storing the information of the GF($2^m$) multiplier/adder node in a hash table to enable sharing of hardware resources.

4. An apparatus according to claim 2, wherein the one or more cuts are made directly above the node with the minimum number of corresponding parents and/or the two sets comprise a first set including the nodes from the top of the initial GPDD down to, but not including the node with the minimum number of parent nodes, and a second set including the node with the minimum number of parent nodes.

5. An apparatus according to claim 2, wherein the one or more cuts are made directly above the node with the maximum number of corresponding parents and/or the two sets comprise a first set including the nodes from the top of the initial GPDD down to, but not including the node with the maximum number of parent nodes, and a second set including the node with the maximum number of parent nodes.

6. An apparatus according to claim 2, wherein the decomposing is multiplicative and/or additive.

7. An apparatus according to claim 2, comprising means for calculating polynomial coefficients wherein the processor is configured to calculate the coefficients for the polynomial corresponding to a specification received by the input and to be fabricated into a circuit.

8. An apparatus according to claim 7 wherein the means for calculating/processor is configured to store the coefficient for a first exponentiation term and calculate the coefficient for a lower exponentiation term by using the stored coefficient for the first term and using an incremental method comprising multiplication and/or addition.

9. An apparatus according to claim 7, wherein the calculated coefficients are stored in the memory, and used to produce the first netlist, in the form of a directed acyclic graph such as a GPDD.

10. An apparatus according to claim 2, wherein the processor is configured to realize an exponentiation in the polynomial into a netlist by repeated multiplication.

11. An apparatus according to claim 2, wherein the first exponentiation of a first variable to be generated is stored in the memory and second exponentiation of the first variable is expressed in terms of a third exponentiation of the variable multiplied by the first exponentiation and then realized by generating the third exponentiation and multiplying it with the stored result of the first exponentiation.

12. An apparatus according to claim 2, where m is greater than 1 wherein the optimization results in a second netlist containing word level blocks, which apparatus comprises synthesizing means configured to synthesize the word level blocks at the bit level, and wherein the processor and memory are configured so that the bit level output is further factorized, determining and extracting common factors in the second netlist by passing through chains of multiplier following chains of adders to generate a factorized netlist, and to use the optimization algorithm on the factorized bit level netlist to generate a bit level netlist, and wherein the circuit fabricator operably fabricates a circuit based on the bit level netlist produced by the processor.

13. An apparatus according to claim 2, where m is greater than 1 wherein the factorization and optimization results in a second netlist containing word level blocks, which apparatus comprises synthesizing means configured to synthesize the word level blocks at the bit level, and conversion means for converting the bit level output to a GPDD, and the processor and memory and/or means to construct are configured to decompose a GPDD, produced by the means for converting, to generate a bit level netlist, the apparatus configured to factorize and/or optimize the bit level netlist as an optimized bit level netlist, and wherein the circuit fabricator operably fabricates a circuit based on the optimized bit level netlist.

14. A Galois Field (GF) circuit apparatus for producing netlists for the fabrication of a $GF(2^m)$ polynomial, comprising:

an input device for receiving a $GF(2^m)$ polynomial for which a circuit is desired;

a processor and memory for producing a first netlist representing the $GF(2^m)$ polynomial;

wherein the processor and memory are configured to decompose a Galois Polynomial Decision Diagram (GPDD) and to factorize a netlist that has chains of adders and chains of multipliers corresponding to the $GF(2^m)$ polynomial, determining factors common to the terms of the $GF(2^m)$ polynomial by passing though the chains of multipliers following the chains of adders and extracting the determined factors common to the terms to generate a factorized netlist; and wherein the processor is configured to run an optimization algorithm stored in the memory on the factorized netlist to generate a second netlist for use in fabricating a circuit.

15. A method of producing a netlist for fabricating a $GF(2^m)$ polynomial, comprising the steps of:

taking a $GF(2^m)$ polynomial for which a circuit is desired;

using a processor to decompose a Galois Polynomial Decision Diagram (GPDD) and to factorize a first netlist that has chains of adders and chains of multipliers representing the $GF(2^m)$ polynomial;

determining factors common to terms of the $GF(2^m)$ polynomial by passing though the chains of multiplier following the chains of adders to generate a factorized netlist; and using the processor to run an optimization algorithm on the factorized netlist to generate a second netlist to fabricate a circuit.

16. A method of producing a netlist for a $GF(2^m)$ polynomial in a circuit, comprising the steps of:

taking a $GF(2^m)$ polynomial for which a circuit is desired;

using a processor to decompose a GPDD based on the $GF(2^m)$ polynomial by cutting nodes of the GPDD into sets, the cuts being selected to reduce one or more of the area, power consumption, or delay of a circuit;

generating a first netlist representing the $GF(2^m)$ polynomial for use in fabricating a circuit;

determining factors common to terms of the $GF(2^m)$ polynomial by passing though chains of multiplier following chains of adders to generate a factorized netlist; and using the processor to run an optimization algorithm on the factorized netlist to generate a second netlist to fabricate a circuit.

17. A method of claim 16, further comprising the step of fabricating a circuit from a netlist based on the first netlist.

18. A method of verifying whether a plurality of optimized netlists produced by the method of claim 16 are functionally equivalent by comparing their structure to see if they are substantially the same.

19. A method of verifying whether a plurality of $GF(2^m)$ polynomials or initial specification corresponding to them are equal by comparing the node structure of the optimized netlists, corresponding to the $GF(2^m)$ polynomials or specifications, produced by the method of claim 16.

20. A Galois Field (GF) circuit apparatus for producing netlists for the fabrication of a $GF(2^m)$ polynomial, comprising:

an input device for receiving a $GF(2^m)$ polynomial for which a circuit is desired;

a processor and memory for producing a netlist representing the $GF(2^m)$ polynomial; and wherein the processor and memory are configured to decompose a Galois Polynomial Decision Diagram (GPDD) based on the $GF(2^m)$ polynomial by cutting nodes of the GPDD into sets the cuts being selected to reduce one or more of the area, power consumption or delay of a circuit, and generate netlist to fabricate a circuit and to determine factors common to terms of the $GF(2^m)$ polynomial by passing though chains of multiplier following chains of adders to generate a factorized netlist; and wherein the processor is configured to run an optimization algorithm on the factorized netlist to generate a second netlist to fabricate a circuit.

21. An apparatus according to claim 1, wherein the optimization algorithm processes recursively from a variable node or a constant node towards a root node, and/or for each $GF(2^m)$ multiplier/adder node, one or more of the following are carried out:

if its two children are constants then the $GF(2^m)$ multiplier/adder node value is replaced with the addition or multiplication over $GF(2^m)$ of its two children, if the $GF(2^m)$ multiplier/adder node is the $GF(2^m)$ multiplication of a child with 1 or the $GF(2^m)$ addition of a child with 0 then it is replaced with the value of that child, if the $GF(2^m)$ multiplier/adder node is the value of the child $GF(2^m)$ multiplied with 0, or the value of the child $GF(2^m)$ added to itself, the node value is replaced with 0, and storing the information of the $GF(2^m)$ multiplier/adder node in a hash table to enable sharing of hardware resources.

* * * * *